(12) United States Patent
Yasuzato

(10) Patent No.: US 8,994,151 B2
(45) Date of Patent: Mar. 31, 2015

(54) SEMICONDUCTOR DEVICE HAVING PLURAL PATTERNS EXTENDING IN THE SAME DIRECTION

(71) Applicant: Elpida Memory, Inc., Tokyo (JP)

(72) Inventor: Tadao Yasuzato, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/899,826

(22) Filed: May 22, 2013

(65) Prior Publication Data

US 2013/0320507 A1   Dec. 5, 2013

(30) Foreign Application Priority Data

May 31, 2012   (JP) ................. 2012-124495

(51) Int. Cl.
*H01L 29/06*   (2006.01)
*H01L 21/768*   (2006.01)
(52) U.S. Cl.
CPC .............. *H01L 29/06* (2013.01); *H01L 21/768* (2013.01)
USPC ....................................................... 257/622
(58) Field of Classification Search
USPC .......... 257/751, 266, 200, 288, 298, E21.579, 257/E21.586, E374, 499–564, 257/E21.757–E21.597, E21.627, E21.641, 257/41, 81, 82, 99, 177–182, 276, 457, 459, 257/573, 584, 602, 621, 664–677, 688–700, 257/734–786, E23.01–E23.079, 257/E23.141–E23.179; 438/762, 643, 687, 438/485, 785, 582, 99, 15, 3, 669, 709, 760, 438/597, 448, 396, 253, 200, 656, 642, 627, 438/648, 622, 629, 630, 637–640, 668, 672, 438/675; 2/751

See application file for complete search history.

(56) References Cited

U.S. PATENT DOCUMENTS

| | | | | |
|---|---|---|---|---|
| 7,943,503 B2* | 5/2011 | Ireland | ........................ | 438/618 |
| 7,999,314 B2* | 8/2011 | Tsuzuki et al. | ............... | 257/335 |
| 8,455,348 B2* | 6/2013 | Yonekura et al. | ............ | 438/626 |
| 8,604,585 B2* | 12/2013 | Kim | ............................. | 257/529 |
| 2010/0187591 A1* | 7/2010 | Nagashima | ................... | 257/314 |
| 2011/0227231 A1* | 9/2011 | Lee et al. | ........................ | 257/773 |
| 2012/0070978 A1* | 3/2012 | Kobayashi | ................... | 438/637 |
| 2012/0119283 A1* | 5/2012 | Lee et al. | ....................... | 257/316 |
| 2013/0234338 A1* | 9/2013 | Uenaka et al. | ................ | 257/774 |

FOREIGN PATENT DOCUMENTS

JP   2009-123878   6/2009

* cited by examiner

*Primary Examiner* — Dao H Nguyen
*Assistant Examiner* — Tram H Nguyen
(74) *Attorney, Agent, or Firm* — Young & Thompson

(57) ABSTRACT

A photomask has a mask blank and a light shielding film formed on the mask blank. The light shielding film includes a plurality of opening traces extending in a first direction. An end of a first opening trace in the first direction and an end of a second opening trace in the first direction are in different positions in the first direction. The second opening trace adjoins the first opening trace.

16 Claims, 38 Drawing Sheets

SEMICONDUCTOR DEVICE HAVING PLURAL PATTERNS EXTENDING IN THE SAME DIRECTION

BACKGROUND OF THE INVENTION

1. Field of the Invention

The present invention relates to a photomask, a semiconductor device, and a method for manufacturing a semiconductor device, and more particularly to a photomask that can prevent a resist film from deteriorating during manufacturing, a semiconductor device manufactured by using the photomask, and a method for manufacturing a semiconductor device by using the photomask.

2. Description of Related Art

Improved integration has been constantly demanded of semiconductor devices such as a dynamic random access memory (DRAM). To achieve this, the processing dimensions of photolithography have been made smaller. Among the miniaturization techniques is oblique incidence illumination.

If a photomask having a line-and-space pattern (hereinafter, referred to as a "LS pattern") is irradiated with vertical light, ±1st-order diffraction beams occur in addition to a 0th-order beam. The two types of ±1st-order diffraction beams are also converged on a wafer through a lens. As the pattern becomes finer, it has become difficult to converge the 0th- and ±1st-order, three types of beams on a single point on the wafer. The oblique incidence illumination is a method for irradiating a photomask with light in an oblique direction so that 0th- and +1st-order, or 0th- and −1st-order, two types of beams are converged for an improved processing accuracy. The oblique incidence illumination can reduce the resolution limit dimensions to approximately ½ as compared to typical illumination in a vertical direction.

Dipole illumination, a type of oblique incidence illumination, improves resolution by irradiating a photomask with light in two directions oblique to an optical axis. For example, a dipole illumination method using two light sources (two poles) arranged on an X-axis improves resolution in the X-axis direction. Such a method is effective for an LS pattern in which opening traces are repetitively arranged in the X-direction. For an LS pattern in which opening traces are repetitively arranged in both X- and Y-axis directions, a cross-pole illumination method using two poles arranged on the X-axis and two poles on the Y-axis, i.e., a total of four poles may be used.

As the degree of integration of semiconductor devices increases, wiring is also becoming finer. Since aluminum wiring is difficult to ensure sufficient reliability, damascened copper wiring is now in the mainstream. Damascened copper wiring is generally formed by the following process.

Initially, an interlayer insulation film such as a silicon oxide film is formed on a semiconductor substrate. A resist film is formed on the interlayer insulation film. Next, an opening pattern of wiring grooves is formed in the resist film by photolithography. Using the resist film having the opening pattern as a mask, the interlayer insulation film is etched to form wiring grooves. Wiring materials such as titanium nitride and copper are embedded into the wiring grooves. The wiring materials lying over the interlayer insulation film are removed by chemical mechanical polishing (CMP) to form copper wring along the wiring grooves (see Japanese Patent Application Laid-Open No. 2009-123878).

As described above, the damascening does not pattern the wiring materials themselves but etches the interlayer insulation film to form wiring grooves. Copper is difficult to pattern by dry etching. When using copper as a wiring material, the damascening is often employed to etch the interlayer insulation film which is easier to process than copper. The foregoing oblique incidence illumination is used when forming the wiring grooves as a LS pattern.

Minimum wiring dimensions have recently been approaching the resolution limit of the photolithographic techniques. The present inventor has recognized the possibility that a resist film can be partly thinned when a fine LS pattern of wiring close to such a resolution limit is formed. More specifically, the present inventor has found that if a photomask has a plurality of opening traces arranged close to each other, the resist film near the ends of an opening trace can be excessively reduced to possibly cause a short circuit of wiring.

SUMMARY

In one embodiment, there is provided a semiconductor device that includes: a semiconductor substrate on which a predetermined layer is formed; a first pattern extending in a first direction on the predetermined layer; a second pattern extending in parallel with the first pattern on the predetermined layer; and a third pattern between the first and second patterns extending in parallel with the first and second patterns on the predetermined layer. The first, second and third patterns have first, second and third end portions in the first direction, respectively. The first and third end portions are arranged in different position from each other in the first direction.

DETAILED DESCRIPTION OF THE EMBODIMENTS

Preferred embodiments of the present invention will be described in detail below with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

While the embodiments deal with a dynamic random access memory (DRAM) as a semiconductor device, the present invention is not limited to DRAMs.

First Embodiment

Before describing a first embodiment of the present invention, a mechanism by which a resist film is unnecessarily reduced when wiring grooves are formed in an interlayer insulation film by damascening will be described.

Figure 34:
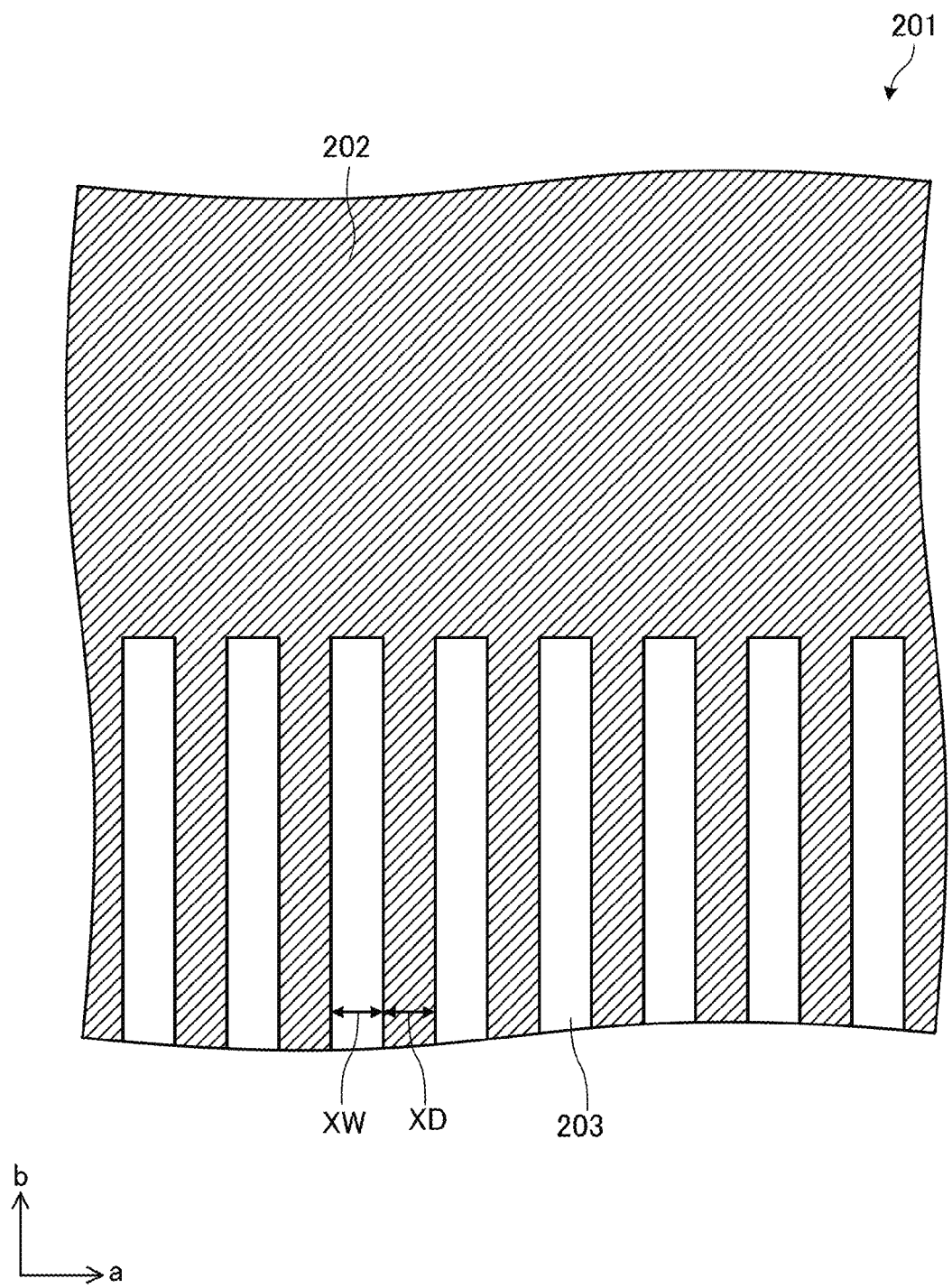
FIG. 34 is a plan view of a typical photomask.

FIG. 34 is a plan view of a typical photomask 201 that is prepared to form a plurality of opening traces. The photomask 201 includes a light shielding film 202 which is formed by evaporating chromium atoms on a mask blank made of synthetic quartz glass or the like. A plurality of opening traces 203 are formed in the light shielding film 202. FIG. 34 shows the vicinity of the top ends of the opening traces 203.

The opening traces 203 are formed in an oblong rectangular shape. The plurality of opening traces 203 are juxtaposed at regular pitches to form a LS pattern. The method for forming a LS pattern on the light shielding film 202 is previously known. Hereinafter, the direction in which the opening traces 203 extend on the photomask 201 will be referred to as a b-direction (first direction). The direction in which the opening traces 203 are arranged will be referred to as an a-direction (second direction). The a-direction and the b-direction are orthogonal to each other.

The opening width of each opening trace 203 will be referred to as a groove width XW. The distance between one opening trace 203 and another will be referred to as a groove distance XD. Assume here that the groove width XW and the groove distance XD are both 40 nm. When using an exposure system with a reduction ratio of 1/4, the groove width XW and the groove distance XD of the photomask 201 are four times the above values. The LS pattern of the photomask 201 is transferred to a resist film of a semiconductor device. The following description will be given on the assumption that ArF excimer laser exposure and oblique incidence illumination are used for transfer.

Next, the process for forming copper wiring of damascene structure by using the photomask 201 will be described with reference to FIGS. 35 to 43.

The semiconductor device includes wiring and transistors which are formed on an interlayer insulation film 212 on a semiconductor substrate 211. Initially, the interlayer insulation film 212 (silicon oxide film) and an antireflection film 215 are formed on the semiconductor substrate 211. A resist film 213 is formed on the antireflection film 215. Next, the resist film 213 is exposed by oblique incidence illumination via the photomask 201 including the opening traces 203. The exposed portions of the resist film 213 are dissolved by a solvent to draw opening traces 214 (grooves) in the resist film 213, whereby the antireflection film 215 is exposed. The resist film 213 having the opening traces 214 will be referred to as a "resist mask."

Figure 35:
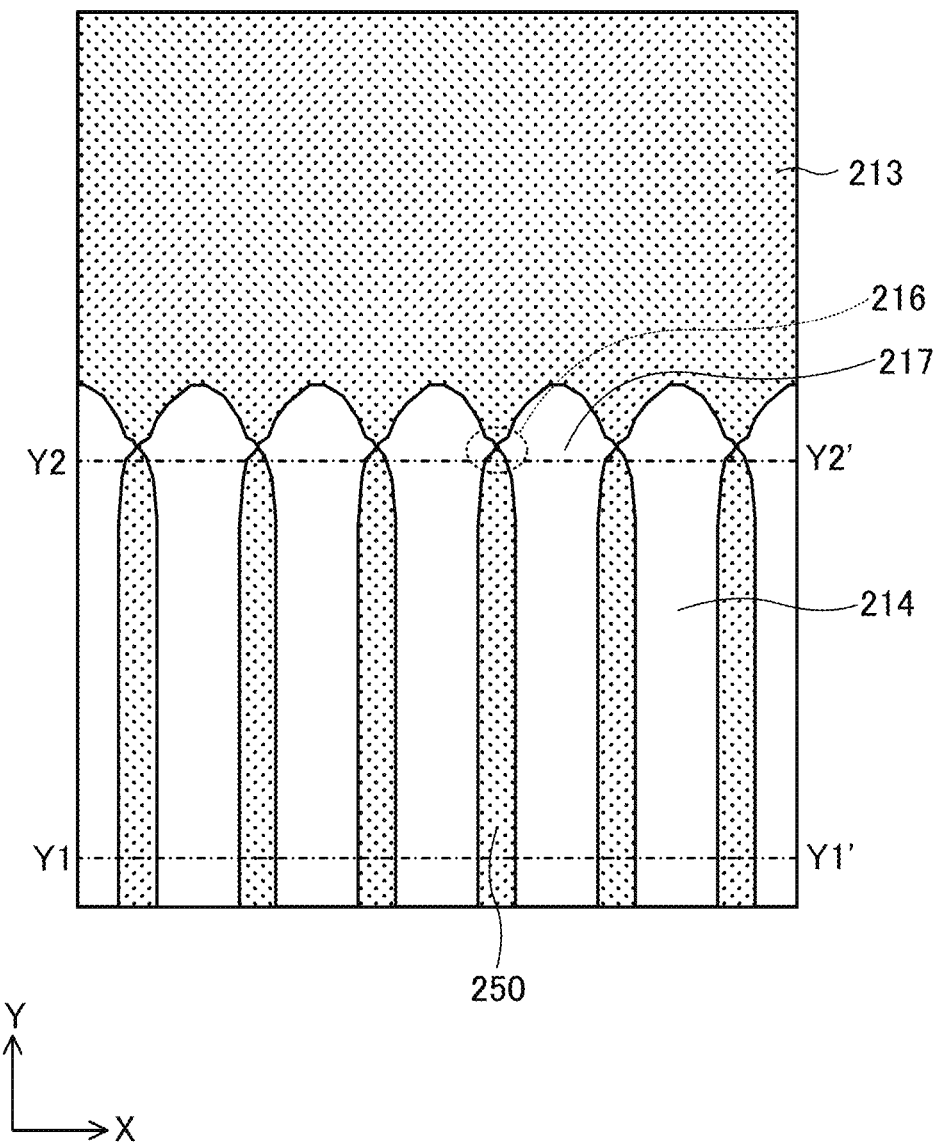
FIG. 35 is a plan view of a LS pattern formed on a resist film by the photomask of FIG. 34.

As shown in FIG. 35, the resist film 213 includes a plurality of opening traces 214 (grooves) which extend in a Y-direction and are arranged in an X-direction. The a-direction and the b-direction of the photomask 201 correspond to the X-direction and the Y-direction of the resist film 213, respectively.

Portions that lie between the opening traces 214 and separate the adjoining opening traces 214 (unexposed portions of the resist film 213) will be referred to as "wall traces 250." The opening traces 214 and the wall traces 250 of the resist film 213 are also shaped to extend in the Y-direction according to the LS pattern of the photomask 201. In fact, the opening traces 214 largely bulge out near the ends (expanding areas 217). As a result, the wall traces 250 are narrowed near the ends of the opening traces 214 (approaching areas 216).

Figure 36:
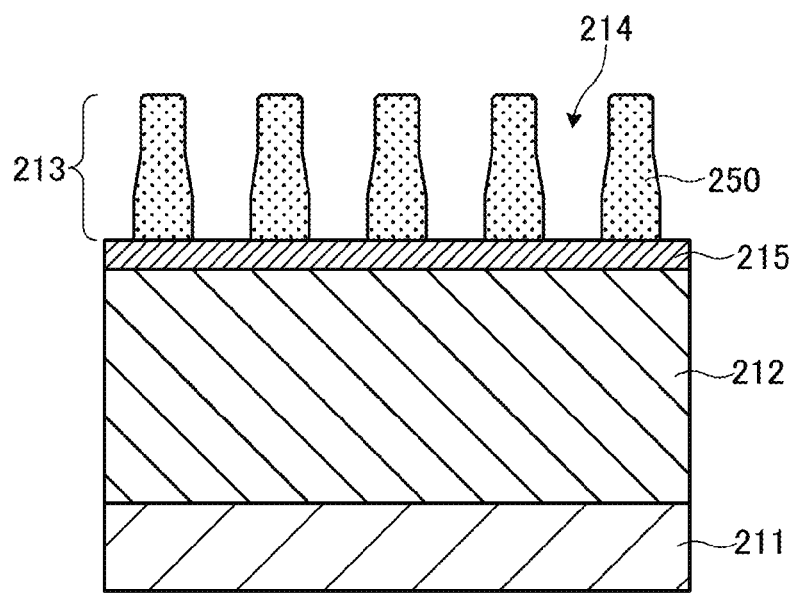
FIG. 36 is a cross-sectional view taken along the line Y1-Y1' of FIG. 35.
Figure 37:
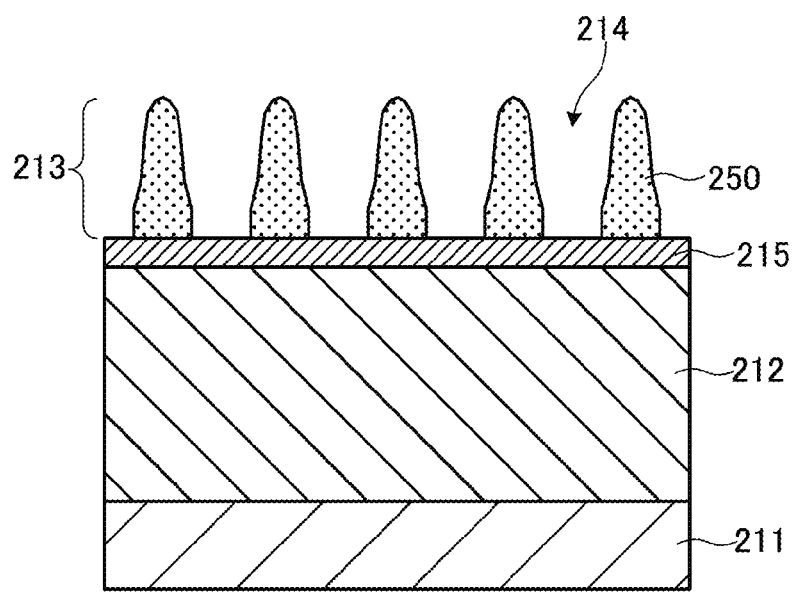
FIG. 37 is a cross-sectional view taken along the line Y2-Y2' of FIG. 35.

FIG. 36 shows a cross-sectional configuration along the line Y1-Y1' which is sufficiently away from the ends of the opening traces 214 of FIG. 35. FIG. 37 shows a cross-sectional configuration along the line Y2-Y2' near the ends of the opening traces 214 of FIG. 35 (approaching areas 216 and expanding areas 217). Referring to FIG. 36, the wall traces 250 sufficiently away from the ends have a rectangular cross-sectional shape with a flat top. Referring to FIG. 37, the wall traces 250 near the ends have a round top and are smaller in thickness.

Using the formed resist film 213 (resist mask) as a mask, the antireflection film 215 and the interlayer insulation film 212 are etched to form wiring grooves 221. The resist film 213 is removed after the etching.

Figure 38:
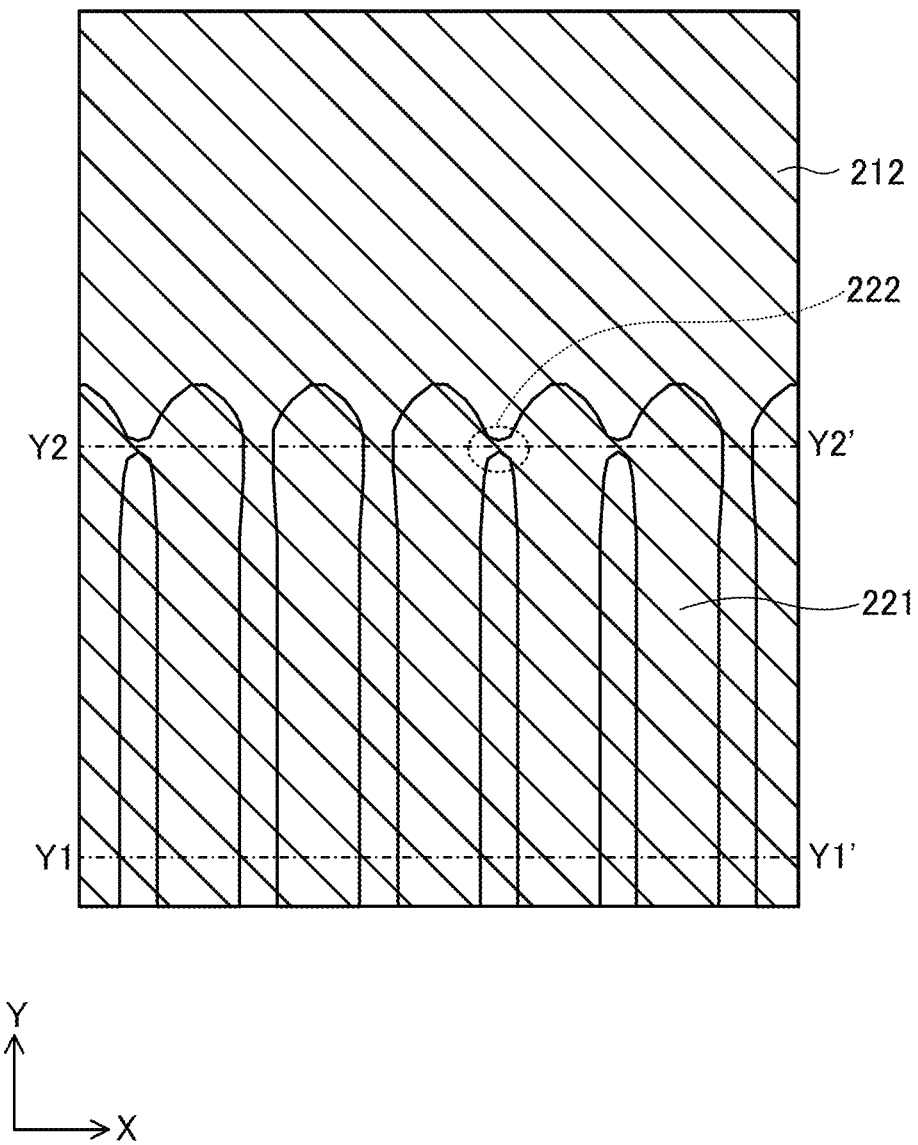
FIG. 38 is a plan view of the interlayer insulation film after the removal of the resist mask.
Figure 39:
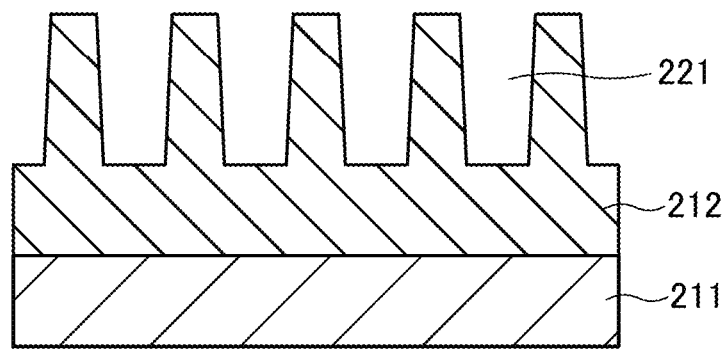
FIG. 39 is a cross-sectional view taken along the line Y1-Y1' of FIG. 38.
Figure 40:
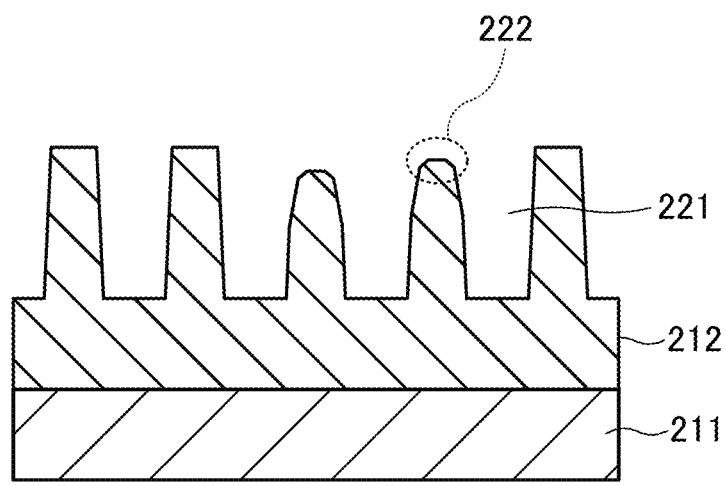
FIG. 40 is a cross-sectional view taken along the line Y2-Y2' of FIG. 38.

The interlayer insulation film 212 has a plurality of wiring grooves 221 which extend in the Y-direction and are juxtaposed at regular pitches in the X-direction. The wiring grooves 221 correspond to the opening traces 203 of FIG. 34 and the opening traces 214 of FIG. 35. Referring to FIG. 38, connecting grooves 222 occur in approaching areas 216 shown in FIG. 35. Since the opening traces 214 of the resist film 213 have the expanding areas 217 at the ends, the wall traces 250 are largely reduced in the approaching areas 216 (see FIG. 37). The thinner wall traces 250 in the approaching areas 216 can only insufficiently protect the interlayer insulation film 212 under the wall traces 250 during dry etching. In other words, the wall traces 250 (resist mask) near the approaching areas 216 have an insufficient dry etching resistance, and the interlayer insulation film 212 are excessively reduced. This can sometimes form connecting grooves 222 to partly connect the wiring grooves 221 which are supposed to be separated.

Figure 41:
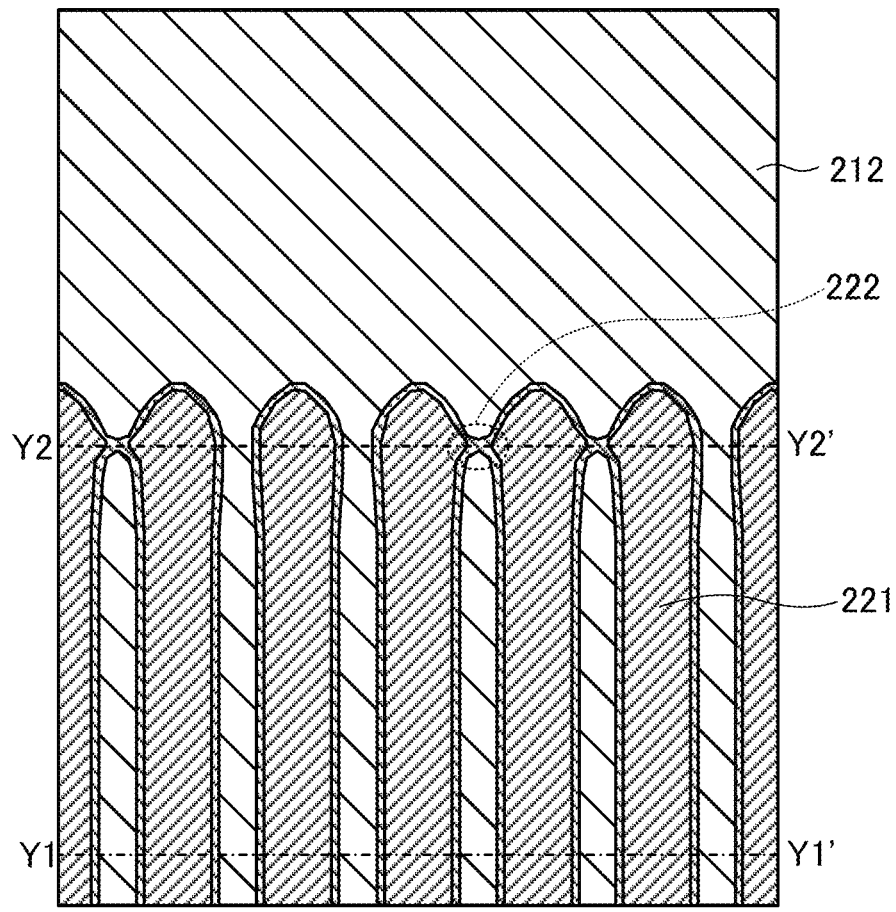
FIG. 41 is a plan view of the interlayer insulation film after wiring materials are embedded.
Figure 42:
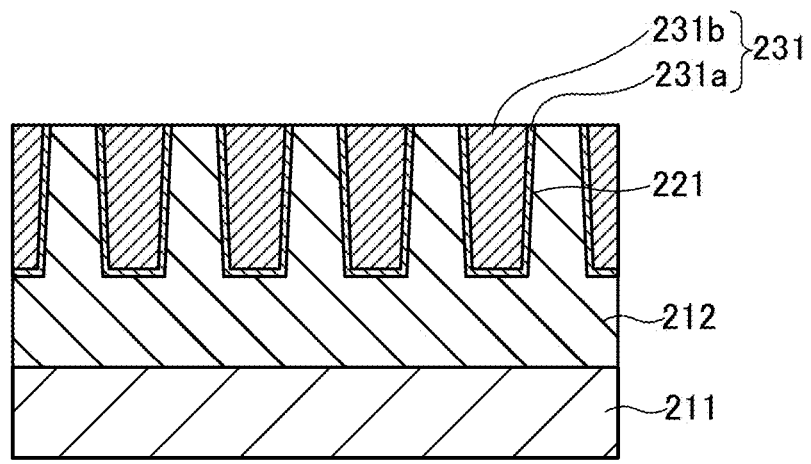
FIG. 42 is a cross-sectional view taken along the line Y1-Y1' of FIG. 41.
Figure 43:
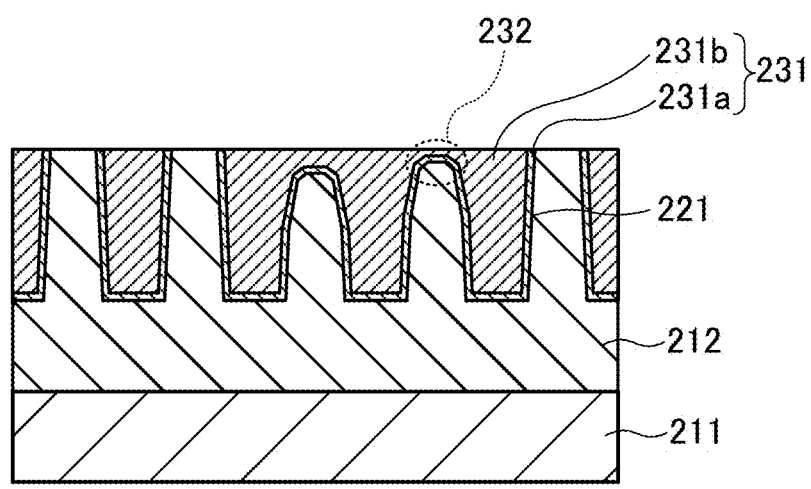
FIG. 43 is a cross-sectional view taken along the line Y2-Y2' of FIG. 41.

Next, wiring materials 231 (titanium nitride 231a and copper 231b) are deposited in the wiring grooves 221. After the embedment of the wiring materials 231, the wiring materials 231 lying above the wiring grooves 221 are removed by CMP. This forms copper wiring of damascene structure in the wiring grooves 221 of the interlayer insulation film 212. The titanium nitride 231a serves as a barrier film, and the copper 231b a conductive film. The lines of the wiring materials 231 extend in the Y-direction and are juxtaposed in the X-direction according to the wiring grooves 221. In FIG. 41, the copper wiring forms bridges 232 in the connecting grooves 222, whereby the adjoining lines of the copper wiring are short-circuited.

Recognizing the phenomenon that some of the wall traces 250 of the resist film 213 can be formed in smaller thicknesses when the wiring grooves 221 are formed in the interlayer insulation film 212 of the semiconductor device by using the photomask 201 having the plurality of opening traces 203, the present inventor has made a study for a solution. As a result of the study, the present inventor has found that when a plurality of opening traces 203 are juxtaposed, the relative image intensity near the ends of the opening traces 203 is not sufficiently low, or equivalently, the relative image intensity on the wall traces 250 in the approaching areas 216 is higher than necessary.

Now, a result of a simulation of a relative image intensity distribution on the resist film 213 when transferring the opening traces 214 to the resist film 213 by using the photomask 201 will be described. Simulation result of image intensity is shown as relative image intensity: area image intensity was normalized with the value at enough large clear area.

Figure 44:
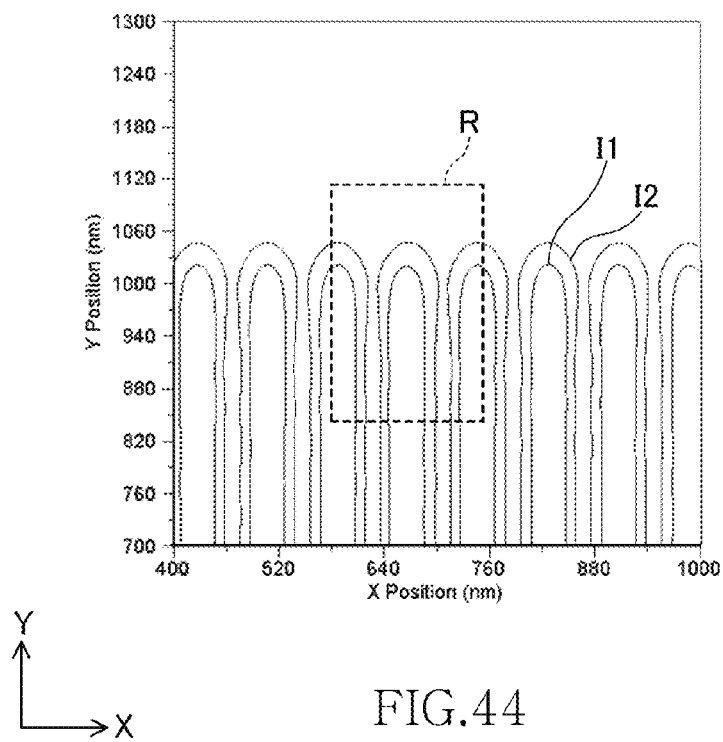
FIG. 44 is a chart showing the relative image intensity distribution resulting from the photomask.
Figure 45:
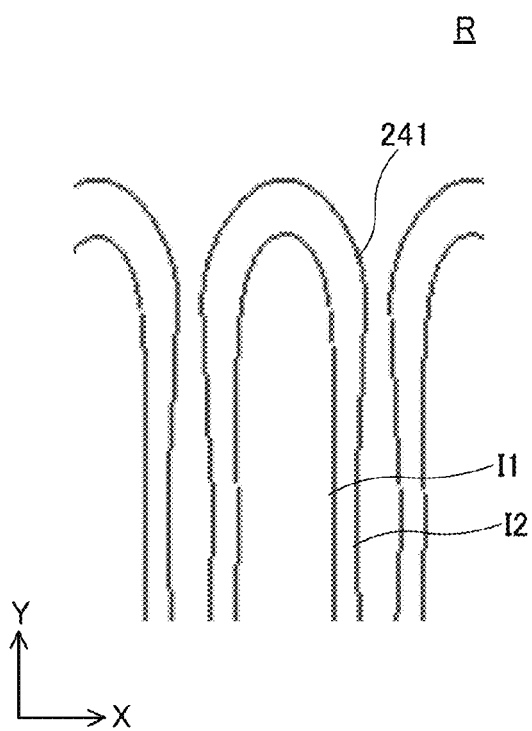
FIG. 45 is an enlarged view of an area R of FIG. 44.

The contours shown in FIGS. 44 and 45 indicate the same relative image intensities. The a- and b-directions of the photomask 201 correspond to the X- and Y-directions of the resist film 213.

The contours I1 indicate a relative image intensity higher than that of the contours I2. Specifically, with the relative image intensity of the contours I1 as 0.211, the relative image intensity of the contours I2 is equivalent to 0.127. Here, the image intensity in the enough large opening area is assumed to be 1.000. The relative image intensity of the contours I1 corresponds to the designed dimensions. The groove distance XD and the groove width XW defined by the contours I1 are 1:1. The areas of the resist film 213 where the relative image intensity is 0.211 or above are sufficiently exposed to expose the interlayer insulation film 212.

Referring to FIGS. 44 and 45, the contours I1 have a favorable shape extending straight in the Y-direction. The contours I2 of lower relative image intensity (relative image intensity approximately 60% that of the contours I1) laterally spread out at the top ends to form a matchstick-like shape. Hereinafter, the bulging portions will be referred as "expanding areas 241." The expanding areas 241 are so close to each other that two contours I2 may come into contact. That is, the relative image intensity near the ends of the wiring grooves 221 is not sufficiently low. It was found that the resist film 213 can be excessively reduced to form connection grooves 222 sometimes (see FIG. 40).

Figure 46:
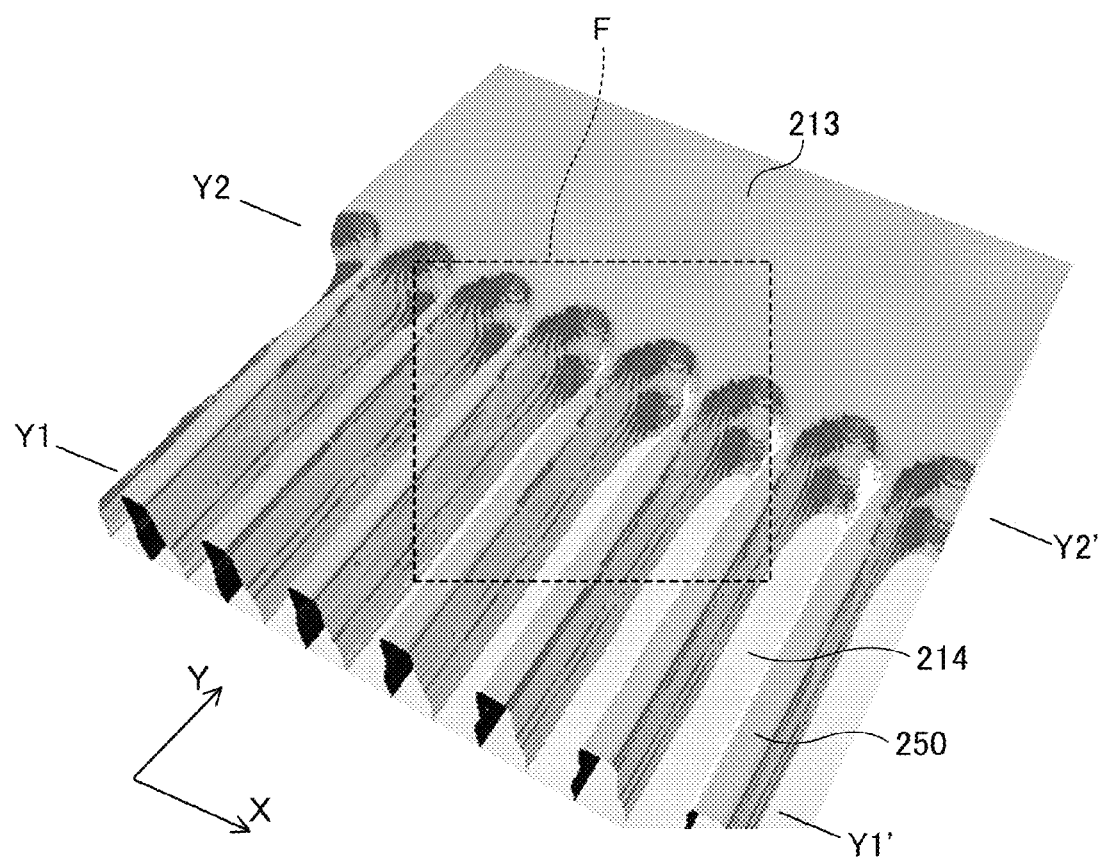
FIG. 46 is a diagram showing the three-dimensional shape of the resist film after exposure.
Figure 47:
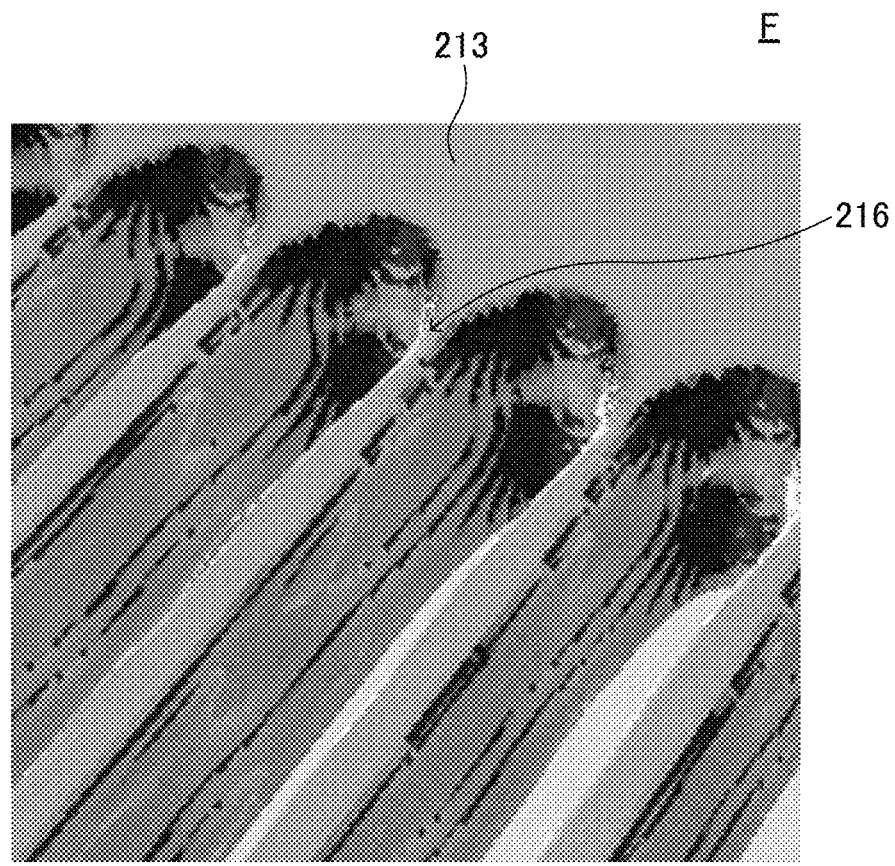
FIG. 47 is an enlarged view of an area F of FIG. 46.

Next, a three-dimensional shape of the resist film 213 having the opening traces 214, determined by a simulated calculation, will be described with reference to FIGS. 46 and 47.

The resist film 213 is formed on the semiconductor substrate 211 and the interlayer insulation film 212. The resist film 213 includes the plurality of opening traces 214 extending in the Y-direction. Adjoining opening traces 214 are separated by wall traces 250. The wall traces 250 have a flat top and are not reduced in thickness at positions sufficiently away from the ends of the opening traces 214. However, the wall traces 250 have a round top near the ends of the opening traces 214. The wall traces 250 even have a reduced width in the approaching areas 216 (see FIG. 35) in particular.

Figure 48:
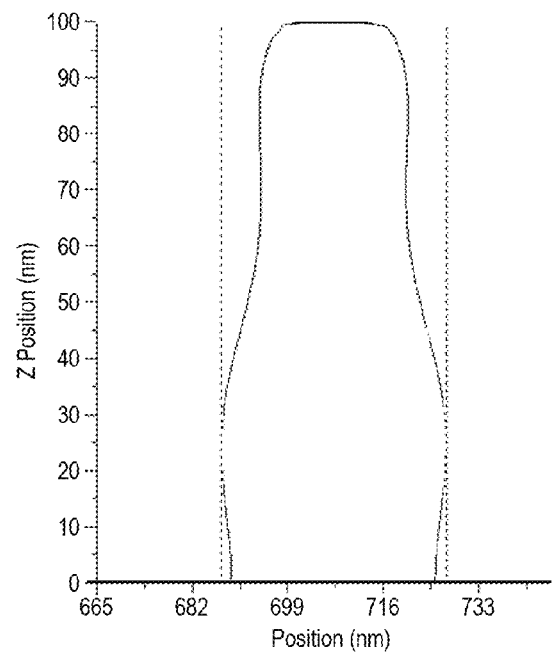
FIG. 48 is a cross-sectional view of a wall trace taken along the line Y1-Y1' of FIG. 46.
Figure 49:
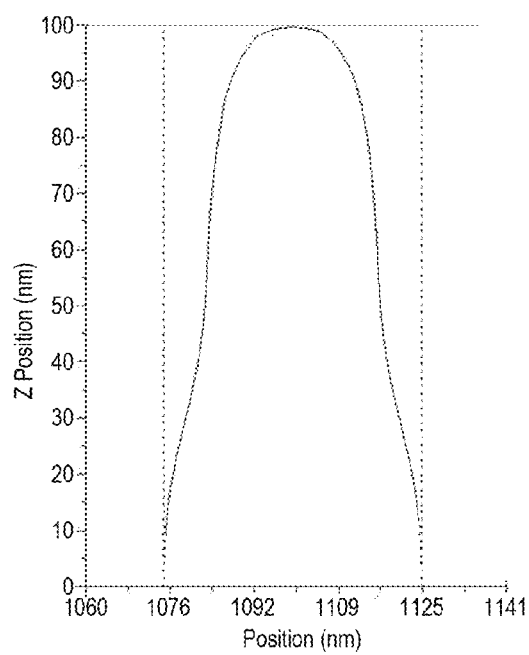
FIG. 49 is a cross-sectional view of a wall trace taken along the line Y2-Y2' of FIG. 46.

In FIG. 48, the resist film 213 (wall trace 250) has a flat top and maintains its thickness (100 nm). In FIG. 49, the resist film 213 (wall trace 250) has a round top with a thickness of approximately 97.6 nm. That is, the thickness is approximately 2.4 nm thinner.

Such simulation results show that the locations for the wall traces 250 to be formed (locations to be shielded from light) near the ends of the opening traces 214 (approaching areas 216) are irradiated with relatively strong light. In other words, part of the light for irradiating the opening traces 214 erodes the wall traces 250 to reduce the thickness of the wall traces 250 in the approaching areas 216.

At positions far from the ends of the opening traces 214 shown by the line Y1-Y1', diffracted light produced by oblique incidence illumination can be sharply converged to draw the fine opening traces 214 on the resist film 213. On the other hand, at positions near the ends of the opening traces 214 shown by the line Y2-Y2', the diffracted light becomes dull to thinly spread out the relative image intensity distribution on the resist film 213. With normal illumination other than oblique incidence illumination, such a problem will not occur because the density of the opening traces 214 has little effect.

Based on the findings from the foregoing simulation results, a method for preventing a short circuit of wiring due to a reduction in thickness, or the formation of a bridge 232 in particular, will be described in conjunction with an embodiment.

Figure 1:
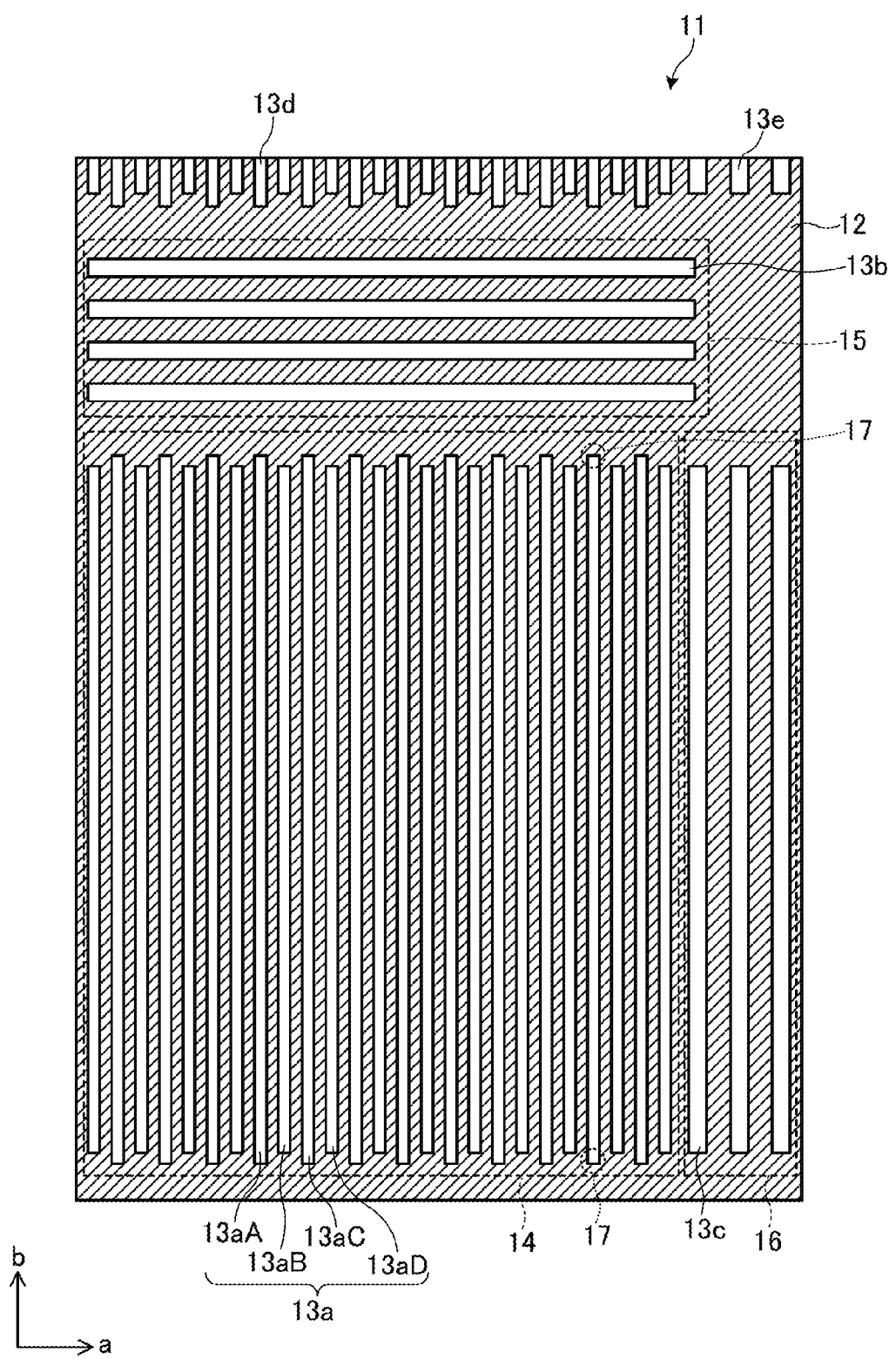
FIG. 1 is a plan view of a photomask according to a first embodiment of the present invention.

Referring now to FIG. 1, the photomask 11 includes a light shielding film 12 formed by evaporating chromium atoms on a mask blank made of synthetic quarts glass or the like. A plurality of opening traces 13 are set in the light shielding film 12.

The photomask 11 includes a first area 14, a second area 15, and a third area 16. In the first area 14, opening traces 13a extending in a b-direction (first direction) are repetitively arranged in an a-direction (second direction). Hereinafter, the direction in which the opening traces 13a are arranged in the first area 14 of the photomask 11 will be referred to as the a-direction. The direction orthogonal to the a-direction will be referred to as the b-direction. Similarly, the direction of a resist film (resist mask) corresponding to the a-direction will be referred to as an X-direction, and the direction corresponding to the b-direction will be referred to as a Y-direction.

The second area 15 is formed above the first area 14. In the second area 15, opening traces 13b extending in the a-direction are repetitively arranged in the b-direction. The third area 16 is formed on the right of the first area 14. In the third area 16, opening traces 13c extending in the b-direction are repetitively arranged in the a-direction. A plurality of opening traces 13d and 13e are further formed above the second area 15. The opening traces 13d and 13e have the same widths as those of the opening traces 13a and 13c, respectively.

A positive resist film suitable for forming a fine pattern is used as the resist film. The opening traces 13 are fully cut out from the light shielding film 12 of the photomask 11.

Figure 2:
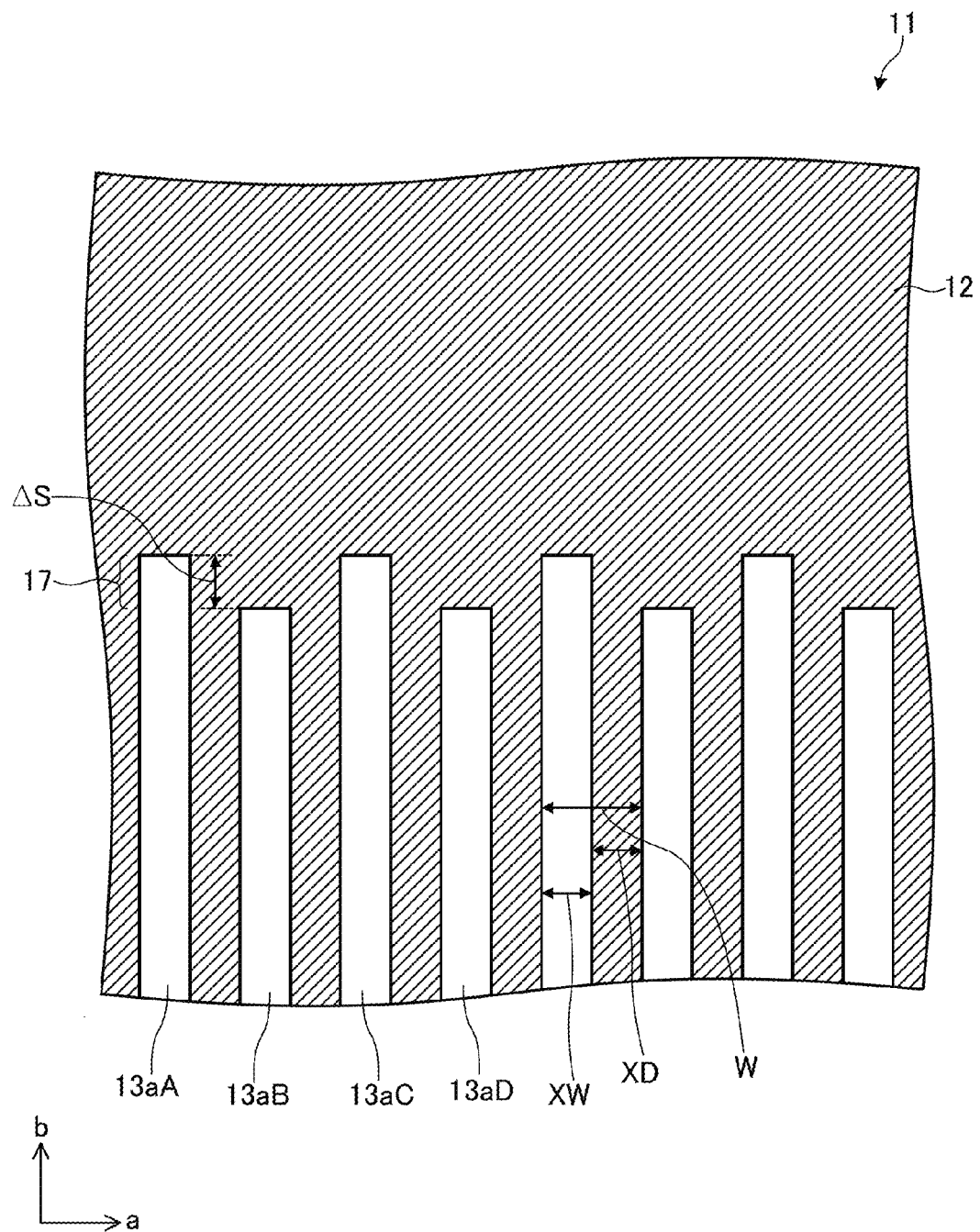
FIG. 2 is a plan view of the vicinity of the top ends of opening traces in the first area.

As shown in FIG. 2, the opening width of each opening trace 13a in the photomask 11 will be referred to as a groove width XW. The distance between one opening trace 13a and another will be referred to as a groove distance XD. A LS pattern formed by the opening traces 13a has a pitch dimension W (=XW+XD). Assume that XW=XD=40 nm and W=80 nm. When using an exposure system with a reduction ratio of 1/4, the groove width XW and groove distance XD of the photomask 11 are four times the above values.

The photolithographic process uses ArF excimer laser exposure (light source wavelength of 193 nm) which is the leading-edge exposure method. The lens' numerical aperture NA is 1.35. The processing dimension of the light shielding film 12, 40 nm, is an approximate minimum processing dimension of the combination of ArF excimer laser exposure and oblique incidence illumination.

Figure 3:
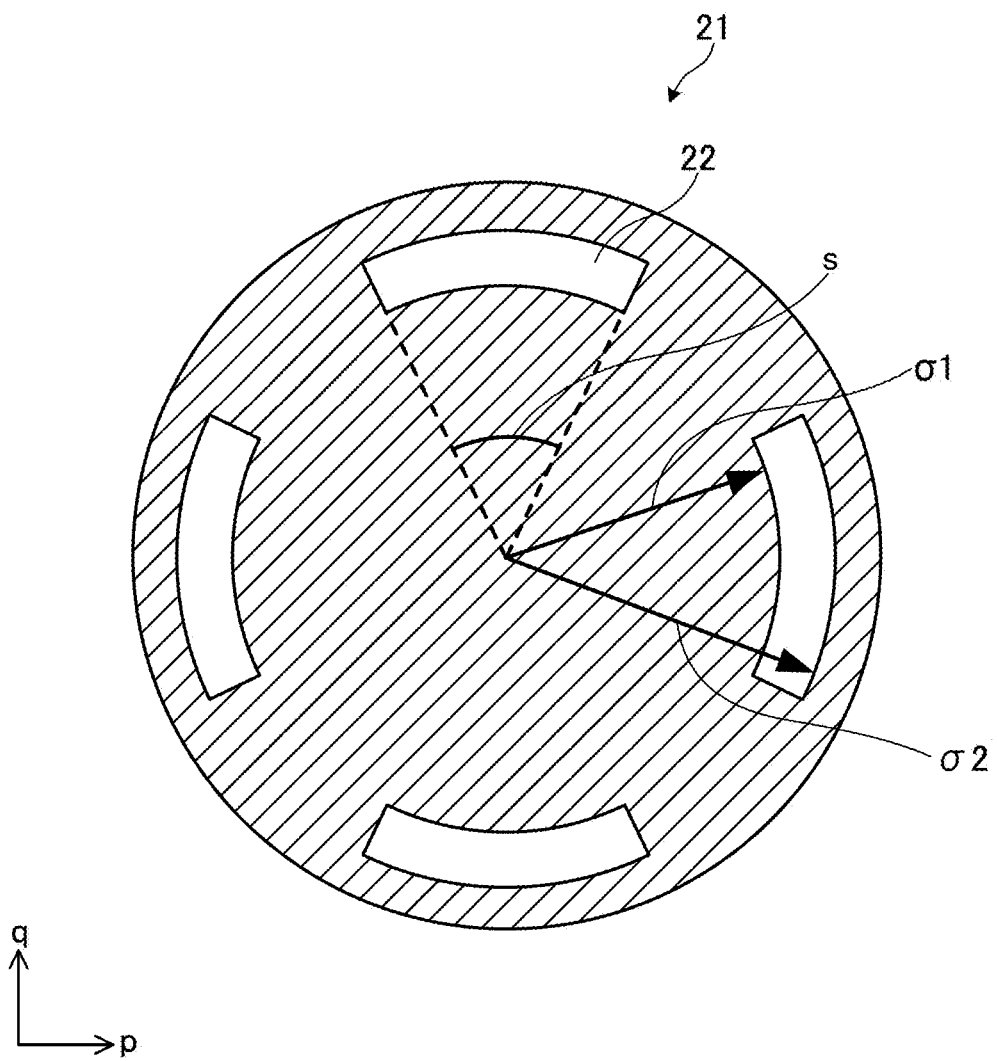
FIG. 3 is a plan view of an illumination aperture diaphragm.

The p-axis and q-axis shown in FIG. 3 are orthogonal to each other. The present embodiment uses cross-pole illumination, which is one of oblique incidence illumination methods. The illumination aperture diaphragm 21 includes four illumination portions 22 which are arranged in a cross configuration. The aperture angle s is 35°, the inner sigma σ1 is 0.70, and the outer sigma σ2 is 0.95. The incident angle of the illumination light on the photomask 11 is set so that an optical-path difference between two adjoining opening traces 13a is ½ the light source wavelength. In addition, polarization effect is usually used to improve image contrast under high NA condition.

The opening traces 13a according to the first embodiment are arranged so that the ends of adjoining opening traces 13a are shifted from each other in the b-direction (see FIGS. 1 and 2). For example, the top end of an opening trace 13aA (first opening trace) lies above (in the b-direction) the top end of an adjoining opening trace 13aB (second opening trace). The top end of the opening trace 13aA lies in the same position in the b-direction as the top end of an opening trace 13aC (third opening trace) which adjoins across the opening trace 13aB. The top end of the opening trace 13aB and that of an opening trace 13aD are in the same position in the b-direction. The top ends of the plurality of opening traces 13a juxtaposed in the a-direction are therefore in staggered positions. The portion of the end of an opening trace 13a protruding from the end of the next opening traces 13a will be referred to as a "protruding portion 17." The amount of protrusion will be denoted by ΔS.

In FIG. 1, the opening traces 13aA and 13aC have protruding portions 17 not only on the top side but also on the bottom side. The opening trace 13aA having the protruding portions 17 is longer than the adjoining opening trace 13aB. In other words, long and short opening traces 13a are alternately arranged in the first area 14.

There holds LA=LB+ΔS×2, where LA is the length of the opening trace 13aA in the b-direction, and LB is the length of the opening trace 13aB in the b-direction. In the present embodiment, LA=10.08 μm, LB=10.00 μm, and ΔS=40 nm (=0.04 μm).

Figure 4:
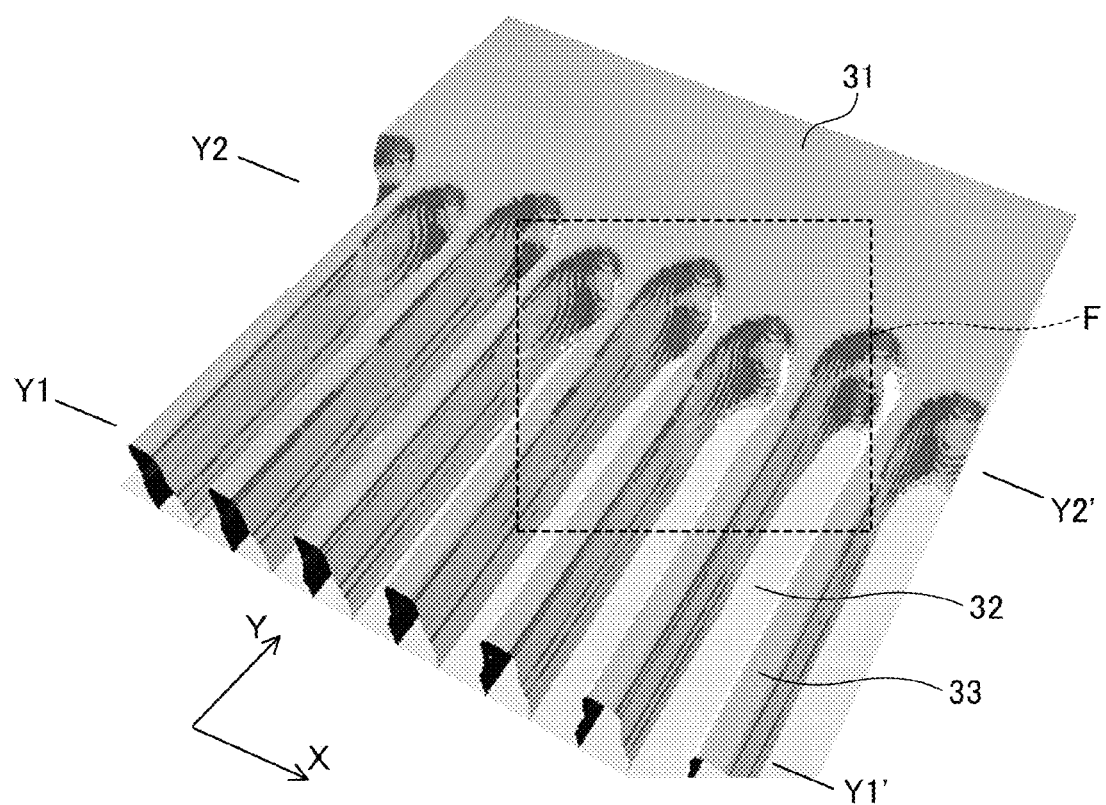
FIG. 4 is a diagram showing the three-dimensional shape of the resist film after exposure.
Figure 5:
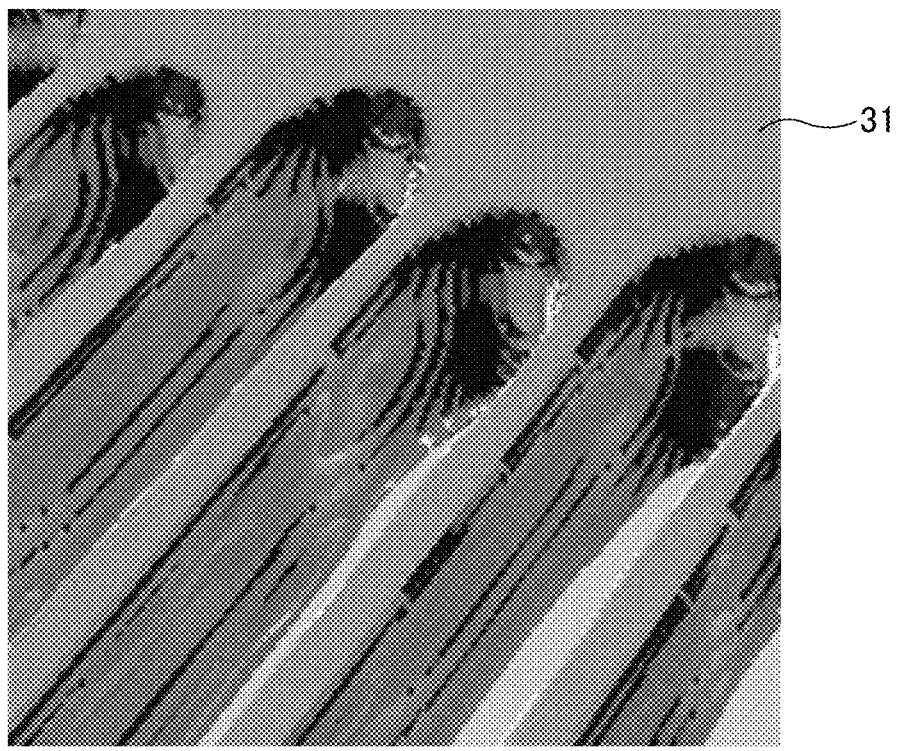
FIG. 5 is an enlarged view of an area F of FIG. 4.

The three-dimensional shape of a resist film to which the opening traces 13 are transferred by using the photomask 11 was determined by a simulated calculation. FIGS. 4 and 5 show a result of the simulated calculation.

The resist film 31 is formed on a semiconductor substrate and an interlayer insulation film. A plurality of opening traces 32 extending in the Y-direction are formed in the resist film 31. Adjoining opening traces 32 are separated by wall traces 33. The opening traces 32 are arranged at regular pitches in the X-direction. The wall traces 33 have a flat top even near the ends of the opening traces 32. There occurs no such phenomenon that the wall traces 33 have a rounded top as shown in FIGS. 46 and 47. The wall traces 33 also have a sufficient thickness and sufficient groove distances XD.

Figure 6:
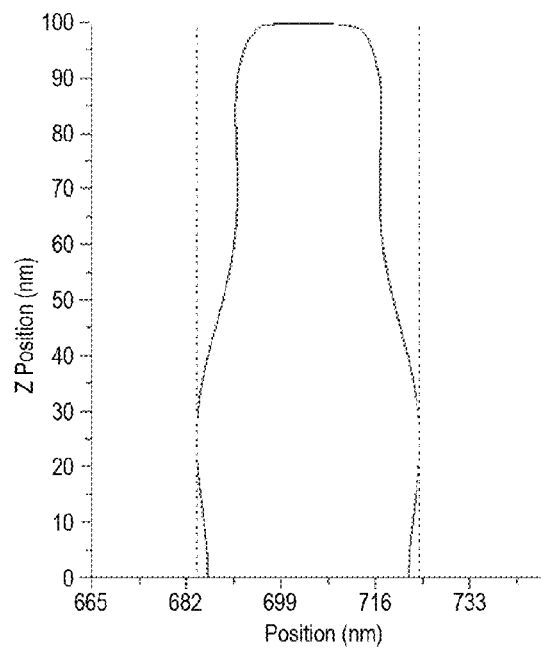
FIG. 6 is cross-sectional view of a wall trace taken along the line Y1-Y1' of FIG. 4.
Figure 7:
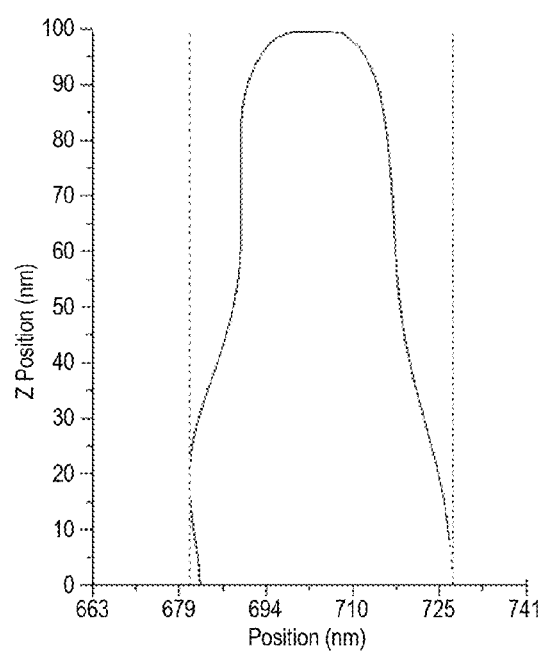
FIG. 7 is a cross-sectional view of a wall trace taken along the line Y2-Y2' of FIG. 4.

In FIG. 6, the resist film 31 (wall trace 33) has a flat top. The resist film 31 (wall trace 33) also has a flat top in FIG. 7. The thickness (100 nm) is also maintained.

Figure 8:
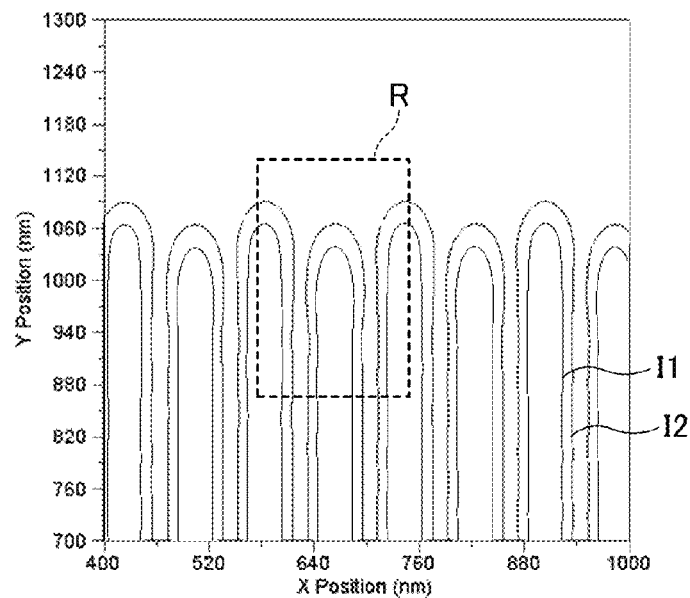
FIG. 8 is a chart showing the relative image intensity distribution resulting from the photomask.
Figure 9:
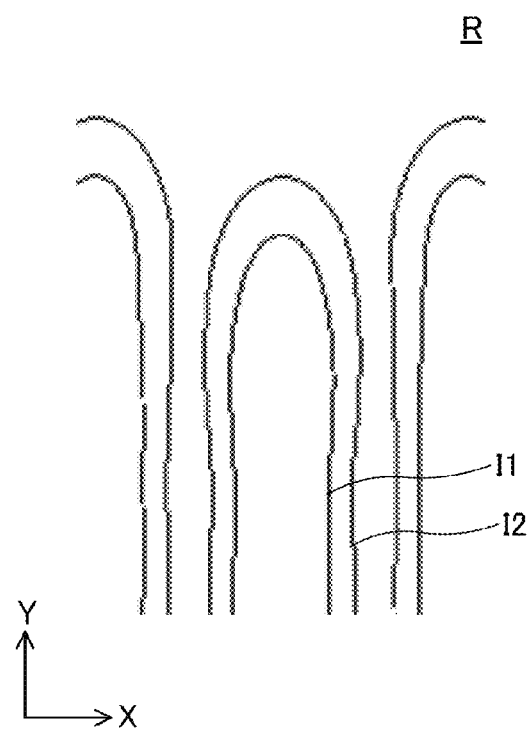
FIG. 9 is an enlarged view of an area R of FIG. 8.

Next, a result of a simulation of a relative image intensity distribution on the resist film 31 when transferring the opening traces 13 to the resist film 31 by using the photomask 11 will be described. FIGS. 8 and 9 show a result of the simulated calculation.

The contours shown in FIGS. 8 and 9 indicate the same relative image intensities. The a- and b-directions of the photomask 11 correspond to the X- and Y-directions of the resist film 31.

The contours I1 indicate a relative image intensity higher than that of the contours I2. Specifically, with the relative image intensity of the contours I1 as 0.211, the relative image intensity of the contours I2 is equivalent to 0.127. The image intensity in the enough large opening area is assumed to be 1.000. The relative image intensity of the contours I1 corresponds to the designed dimensions. The groove distance XD and the groove width XW defined by the contours I1 are 1:1. The areas of the resist film 31 where the relative image intensity is 0.211 or above are sufficiently exposed to expose the interlayer insulation film 212.

Referring to FIGS. 8 and 9, the contours I1 have a favorable shape extending straight in the Y-direction. The contours I2 of lower relative image intensity also have a favorable, near straight shape, whereas the top ends tend to spread slightly in the lateral direction (X-direction). As compared to the relative image intensity distribution shown in FIGS. 44 and 45, the relative image intensity distribution shown in FIGS. 8 and 9 shows no clear expanding area 241 at the ends of the opening traces 32. The relative image intensity is found to be sufficiently low across the entire areas of the opening traces 13. This reduces the possibility that the resist film 31 might be excessively reduced to form a connecting groove 222.

According to the first embodiment, the relative image intensity can be sufficiently lowered across the entire areas of the wall traces 33 formed on the resist film 31. The end of an opening trace 32 formed in the resist film 31 corresponding to the opening trace 13aA is shifted in a +Y-direction from the end of an opening trace 32 corresponding to the opening trace 13aB. According to such a configuration, diffracted light near the end of the opening trace 13aB can be clearly converged on the resist film 31 for higher contrast.

If an opening trace 32 has an end protruding in the Y-direction, there is no ends of adjoining opening traces 32 on either side. This lowers the contrast in the vicinity of the protruding portion 17, and the opening trace 32 tends to shrink in the length direction. Some shrinkage practically does not matter because the end is protruded from the adjoin opening traces 32 in the first place.

According to a study of the inventor, effective ΔS is one half the pitch dimension W or greater, or equivalently, greater than or equal to an average value of the groove distance XD and the groove width XW. Protruding portions 17 having such ΔS can be provided to secure sufficient contrast at the ends of the opening traces 32. In the first embodiment, ΔS is desirably 40 nm or greater.

The oblique incidence illumination method is not limited to the cross-pole illumination. Other oblique incidence illumination methods such as dipole illumination and zone plate illumination may be used.

In the first embodiment, long and short opening traces 13a are alternately arranged in the first area 14. However, not only long and short, two types of opening traces, but long, medium, and short, three types of opening traces may be arranged in turns.

Aside from the ArF excimer laser exposure, KrF excimer laser exposure or i-line exposure may be employed according to the wiring dimensions. A reflecting mask for EUV exposure (light source wavelength of 13.5 nm) and the like may be applied. For EUV exposure, a photomask including a reflection layer between a mask blank and a light shielding film 12 may be used.

In FIG. 1, the opening trace 13aA is extended at both the top and bottom ends as compared to the adjoining opening trace 13aB. In other words, the opening trace 13aA is longer than the opening trace 13aB. However, as shown in FIG. 10, the opening trace 13aA and the adjoining opening trace 13aB may have the same length.

Figure 10:
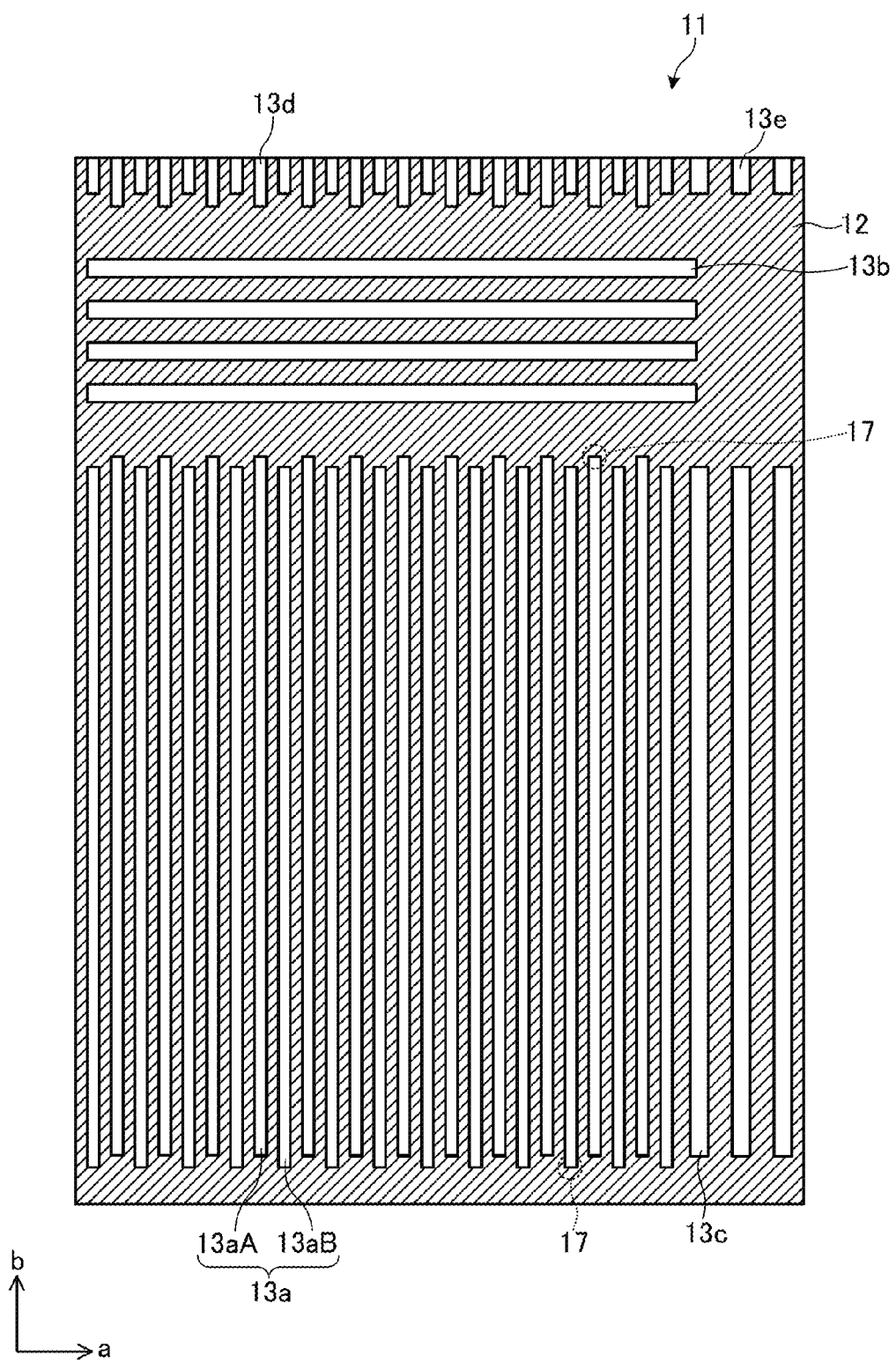
FIG. 10 is a plan view of a photomask according to the modification of the first embodiment.

The light shielding film 12 of the photomask 11 shown in FIG. 10 includes a plurality of opening traces 13a to 13e. The opening traces 13aA and 13aB have the same length. The opening trace 13aA protrudes at the top side. The opening trace 13aB protrudes at the bottom side. Even with such a configuration, the top and bottom ends of the plurality of opening traces 13a juxtaposed in the a-direction can be located in staggered positions.

Next, a process for forming the copper wiring of damascene structure by using the photomask 11 will be described with reference to FIGS. 11 to 22.

Figure 11:
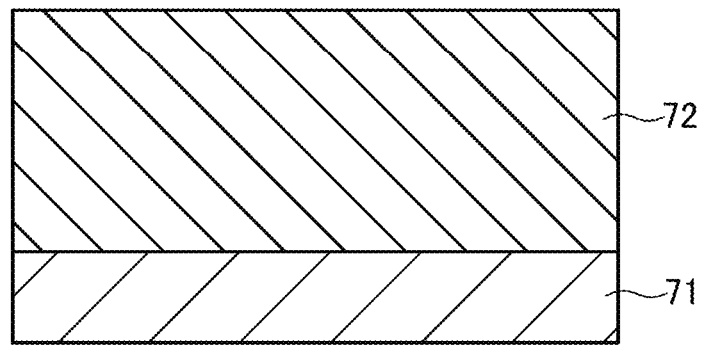
FIG. 11 is a diagram showing the first step for manufacturing the semiconductor device.
Figure 12:
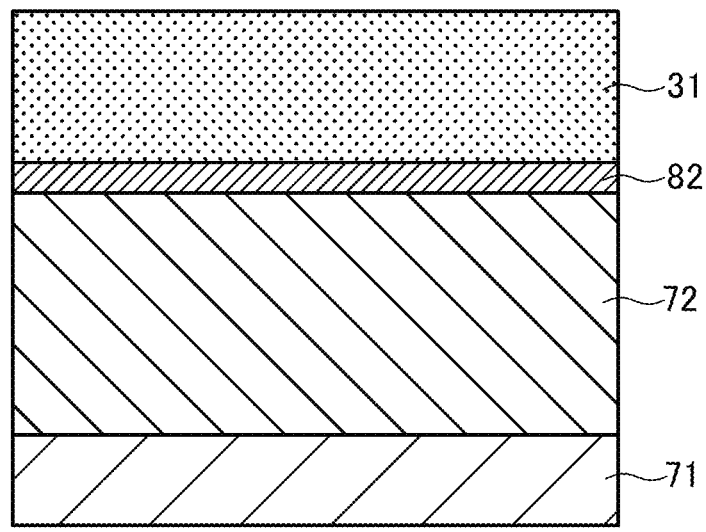
FIG. 12 is a diagram showing the second step for manufacturing the semiconductor device.

As shown in FIGS. 11 and 12, an interlayer insulation film 72 (silicon oxide film) and an antireflection film 82 are formed on a semiconductor substrate 71. A resist film 31 is formed on the antireflection film 82.

The resist film 31 is exposed by oblique incidence illumination via the photomask 11 of FIG. 1. The exposed portions of the resist film 31 are dissolved by a solvent to draw the opening traces 32 (grooves) in the resist film 31 and expose the antireflection film 82. The designed values of the widths of the opening traces 32 and the wall traces 33 are both 40 nm.

Figure 13:
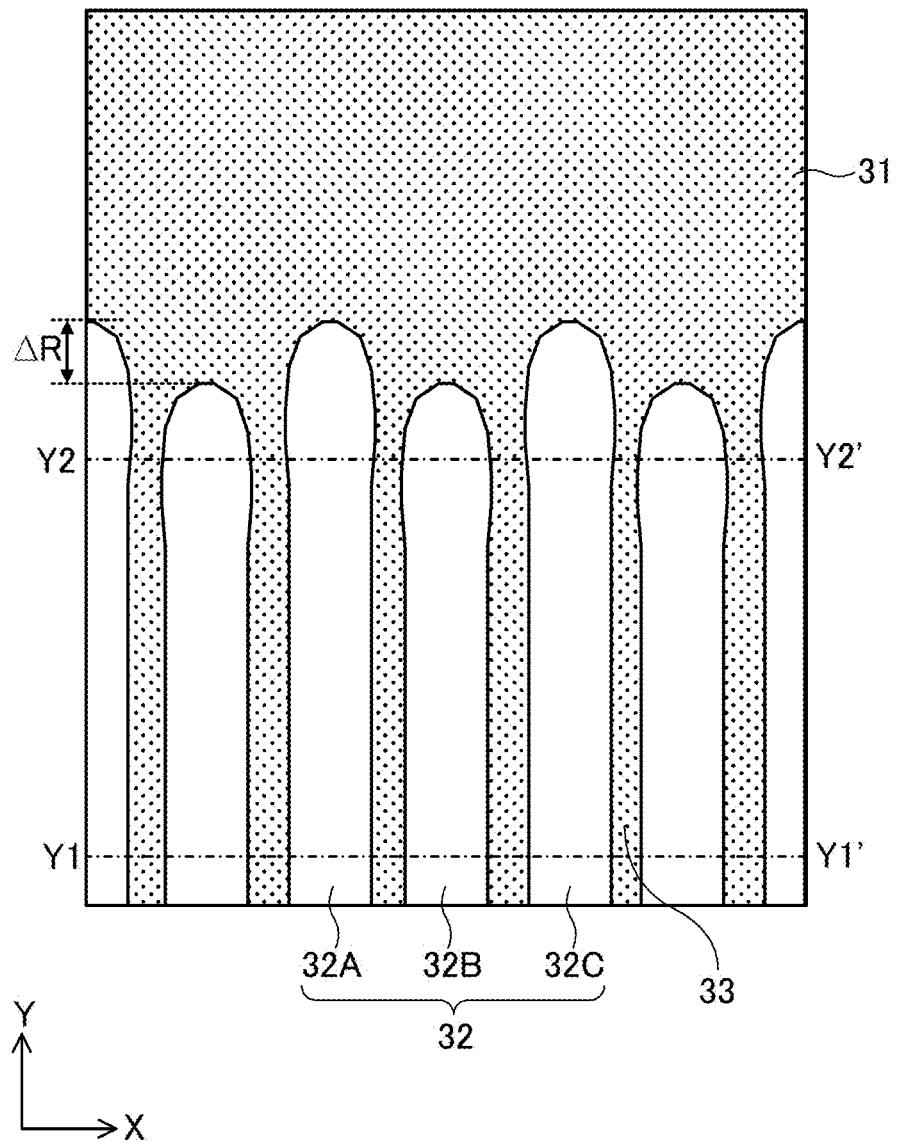
FIG. 13 is a plan view of a LS pattern formed on the resist film by using the photomask of FIG. 1.

As shown in FIG. 13, a plurality of opening traces 32 (grooves) extending in the Y-direction, arranged at regular pitches in the X-direction, are formed in the resist film 31. The a-direction and b-direction of the photomask 11 correspond to the X-direction and Y-direction of the resist film 31. The opening trace 32A corresponds to the opening trace 13aA. The opening trace 32B corresponds to the opening trace 13aB. The end of the opening trace 13aA is shifted from that of the opening trace 13aB in the b-direction. The end of the opening trace 32A is thus shifted from that of the opening trace 32B in the Y-direction. In FIG. 13, the amount of shift is ΔR. ΔR is smaller than the designed shift of the photomask 11, 40 nm. By simulation, ΔR was founded to be approximately 30 nm. The portion lying between the opening traces 32A and 32B to separate the adjoining opening traces 32 (an unexposed portion of the resist film 31) makes a wall trace 33.

The opening traces 32A and 32B extend in the Y-direction. The top of the wall trace 33 near the ends of the opening traces 32A and 32B is not rounded (see FIGS. 4 and 5).

Figure 14:
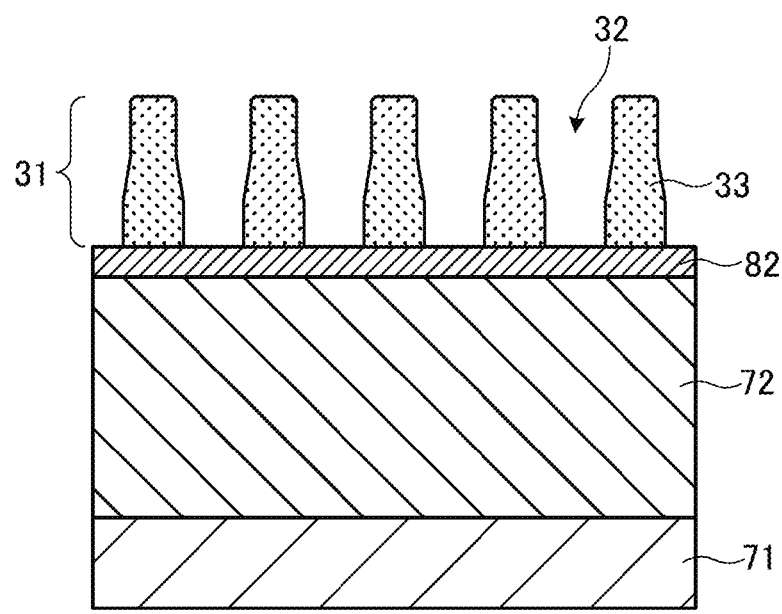
FIG. 14 is a cross-sectional view taken along the line Y1-Y1' of FIG. 13.
Figure 15:
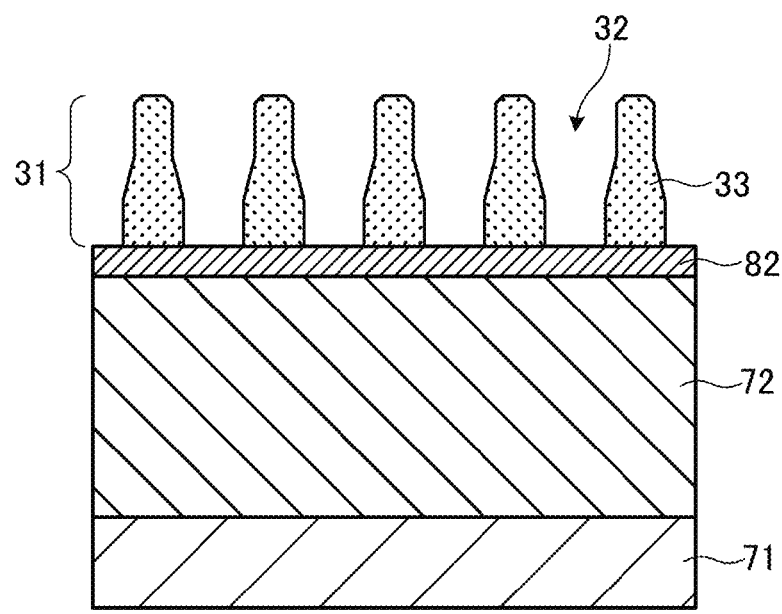
FIG. 15 is a cross-sectional view taken along the line Y2-Y2' of FIG. 13.

FIG. 14 shows a cross-sectional configuration along the line Y1-Y1' which is sufficiently away from the ends of the opening traces 32 of FIG. 13. FIG. 15 shows a cross-sectional configuration along the line Y2-Y2' near the ends of the opening traces 32 of FIG. 13. Both in FIGS. 14 and 15, the wall traces 33 have a rectangular shape with a planar top.

Figure 16:
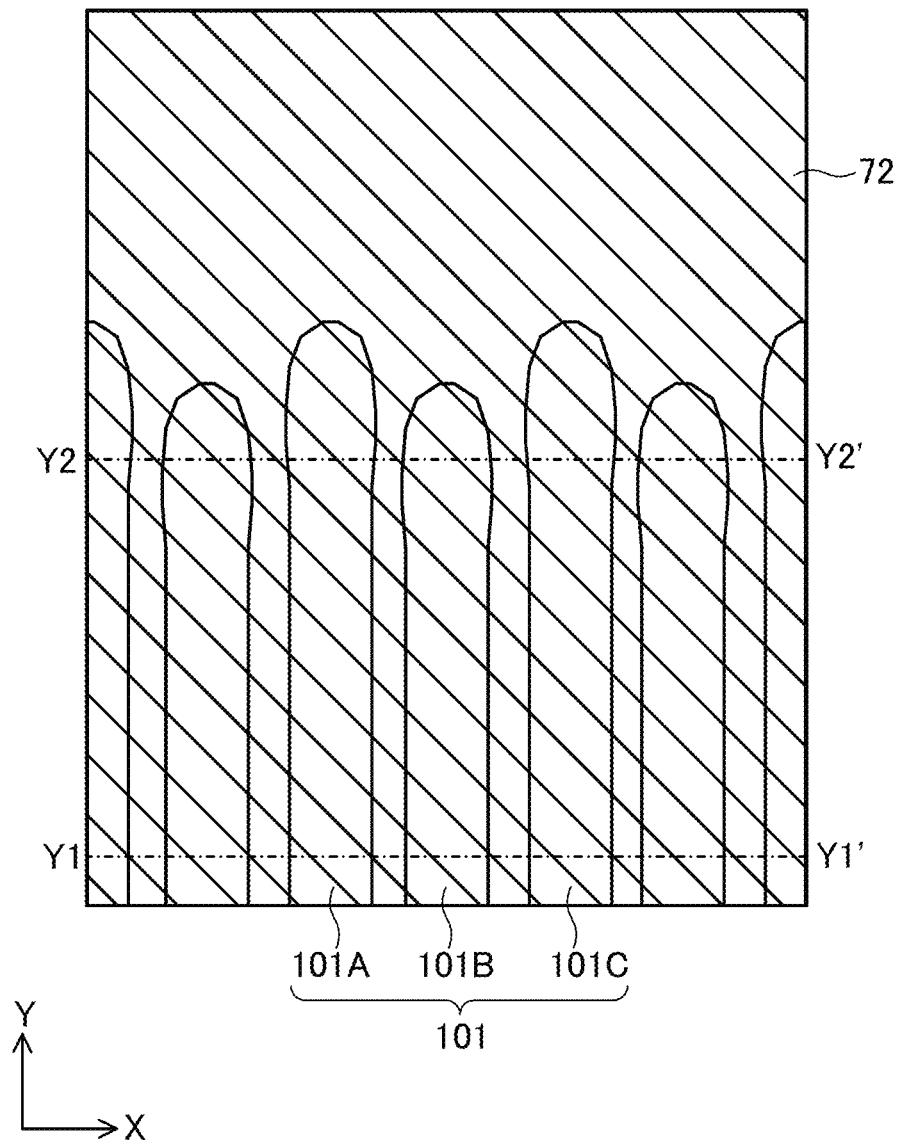
FIG. 16 is a plan view of the interlayer insulation film after the resist mask is removed.
Figure 17:
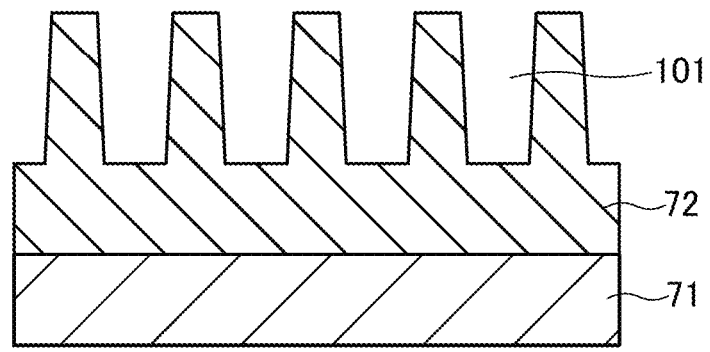
FIG. 17 is a cross-sectional view taken along the line Y1-Y1' of FIG. 16.
Figure 18:
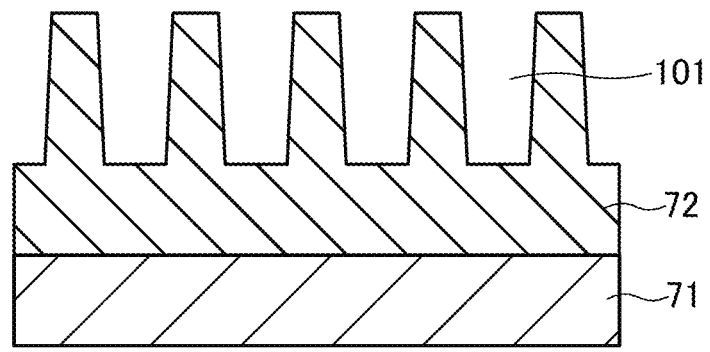
FIG. 18 is a cross-sectional view taken along the line Y2-Y2' of FIG. 16.

As shown in FIGS. 16 to 18, using the resist film 31 (resist mask) as a mask, the antireflection film 82 and the interlayer insulation film 72 are etched by dry etching to form wiring grooves 101. The resist film 31 is removed after the etching.

A plurality of wiring grooves 101 extending in the Y-direction, juxtaposed at regular pitches in the X-direction, are formed in the interlayer insulation film 72. The wiring grooves 101 correspond to the opening traces 13 of FIG. 1 and the opening traces 32 of FIG. 13. The wiring groove 101A corresponds to the opening trace 32A. The wiring groove 101B corresponds to the opening trace 32B. The end of the wiring groove 101A is shifted from that of the wiring groove 101B in the Y-direction. As shown in FIGS. 14 and 15, the wall traces 33 maintain the thickness across the entire area. The resist film 31 therefore will not be eroded or destroyed by the etching, and can form the favorable wiring grooves 101. This suppresses the possibility of the formation of a connecting groove 222. The cross-sectional view along the line Y1-Y1' (FIG. 17) and the cross-sectional view along the line Y2-Y2' (FIG. 18) have almost the same shape.

Figure 19:
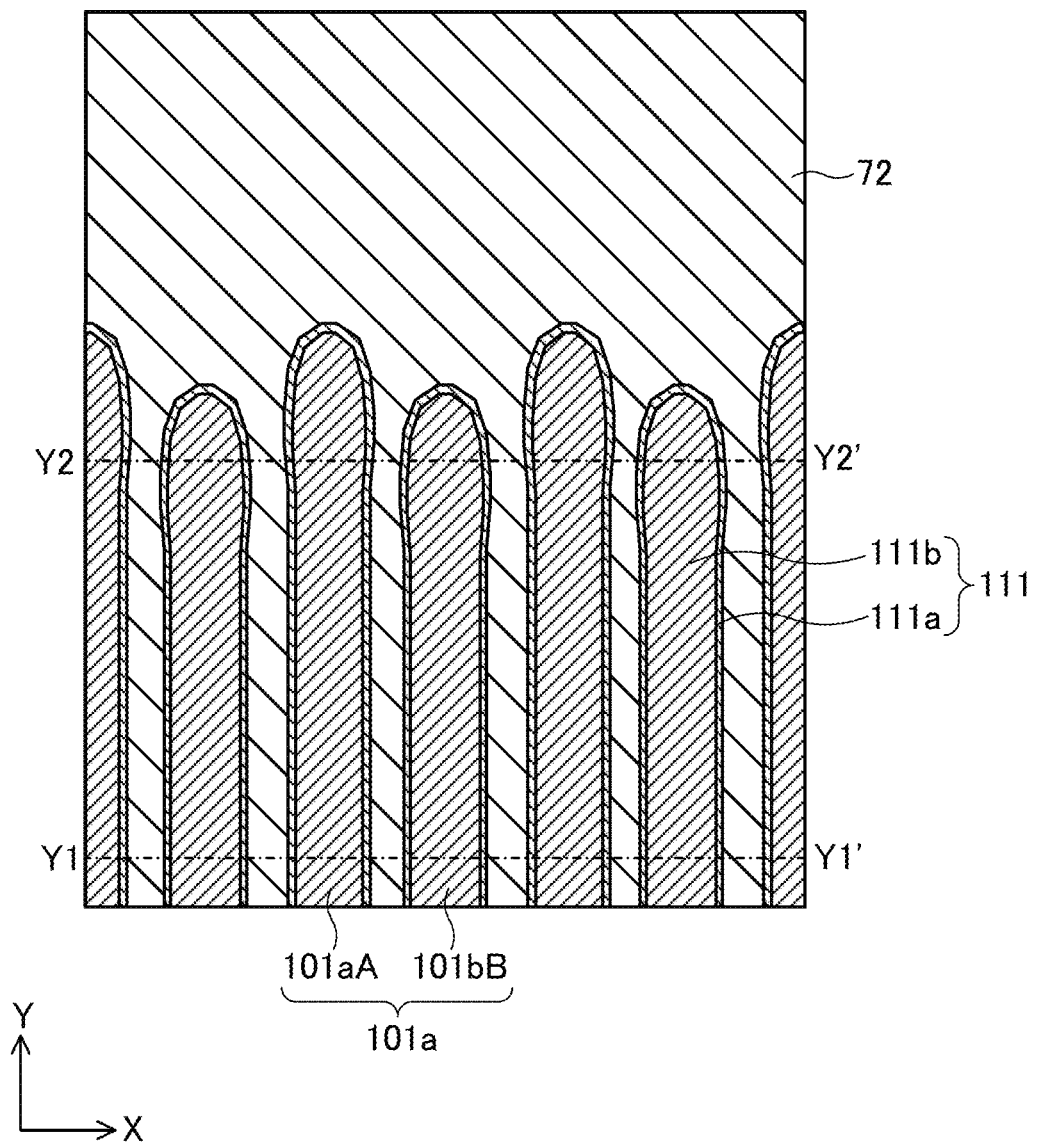
FIG. 19 is a plan view of the interlayer insulation film after wiring materials are embedded.
Figure 20:
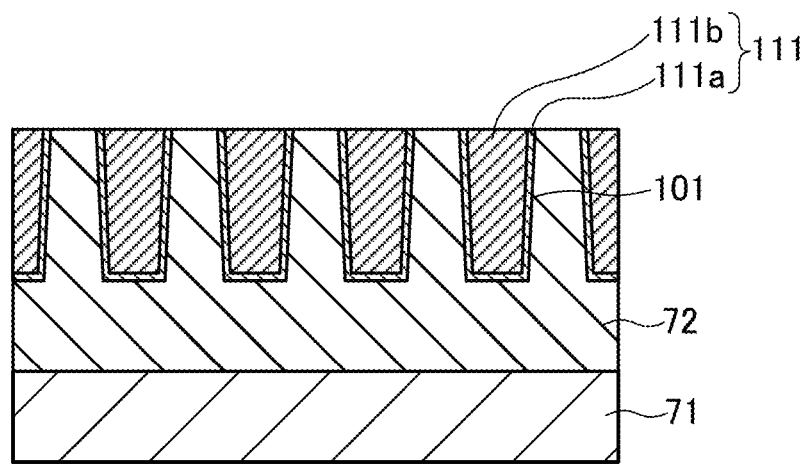
FIG. 20 is a cross-sectional view taken along the line Y1-Y1' of FIG. 19.
Figure 21:
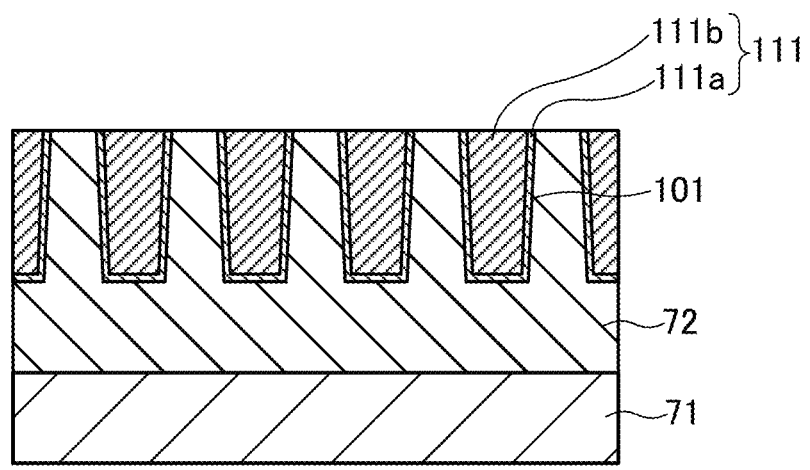
FIG. 21 is a cross-sectional view taken along the line Y2-Y2' of FIG. 19.

Next, as shown in FIGS. 19 to 21, wiring materials 111 (titanium nitride 111a and copper 111b) are deposited in the wiring grooves 101. The titanium nitride 111a serves as a barrier film, and the copper 111b a conductive film. The wiring materials 111 are not limited to the titanium nitride 111a and the copper 111b. A titanium nitride film and a tungsten film may be deposited. An impurity-doped silicon film may be used.

After the embedment of the wiring materials 111, the wiring materials 111 lying above the wiring grooves 101 are removed by CMP. This forms the copper wiring of damascene structure in the wiring grooves 101 of the interlayer insulation film 72. The wiring groove 101aA corresponds to the opening trace 32A. The wiring groove 101aB corresponds to the opening trace 32B. The end of the wiring groove 101aA is shifted from that of the wiring groove 101aB in the Y-direction. As shown in FIG. 18, there is formed no connecting groove 222. This prevents the adjoining wiring grooves 101 (copper lines) from being short-circuited by a bridge 232. The cross-sectional view along the line Y1-Y1' (FIG. 20) and the cross-sectional view along the line Y2-Y2' (FIG. 21) have almost the same shape. The photomask 11 can be used to form finer wiring of damascene structure.

Second Embodiment

In the first area 14 of the photomask 11 shown in FIG. 1, the opening traces 13a extend in the b-direction. In the second area 15, the opening traces 13b extend in the a-direction. Even if the ends of the opening traces 13a are close to the opening traces 13b, a favorable LS pattern is found to be able to be formed by locating the ends of the opening traces 13a in uneven positions.

According to a study of the present inventor, it has been found that if the wiring traces 13b are arranged near the ends of the opening traces 13a, part of light transmitted through the opening traces 13b can reach near the ends of the opening traces 13a during the formation of the exposure pattern. The part of the light transmitted through the opening traces 13b is superposed on the light transmitted through the opening traces 13a. The superposition of the transmitted light lowers contrast on the resist film 31. Initially, an adverse effect from the presence of the opening traces 13b on a typical arrangement of opening traces 13a will be described.

Figure 22:
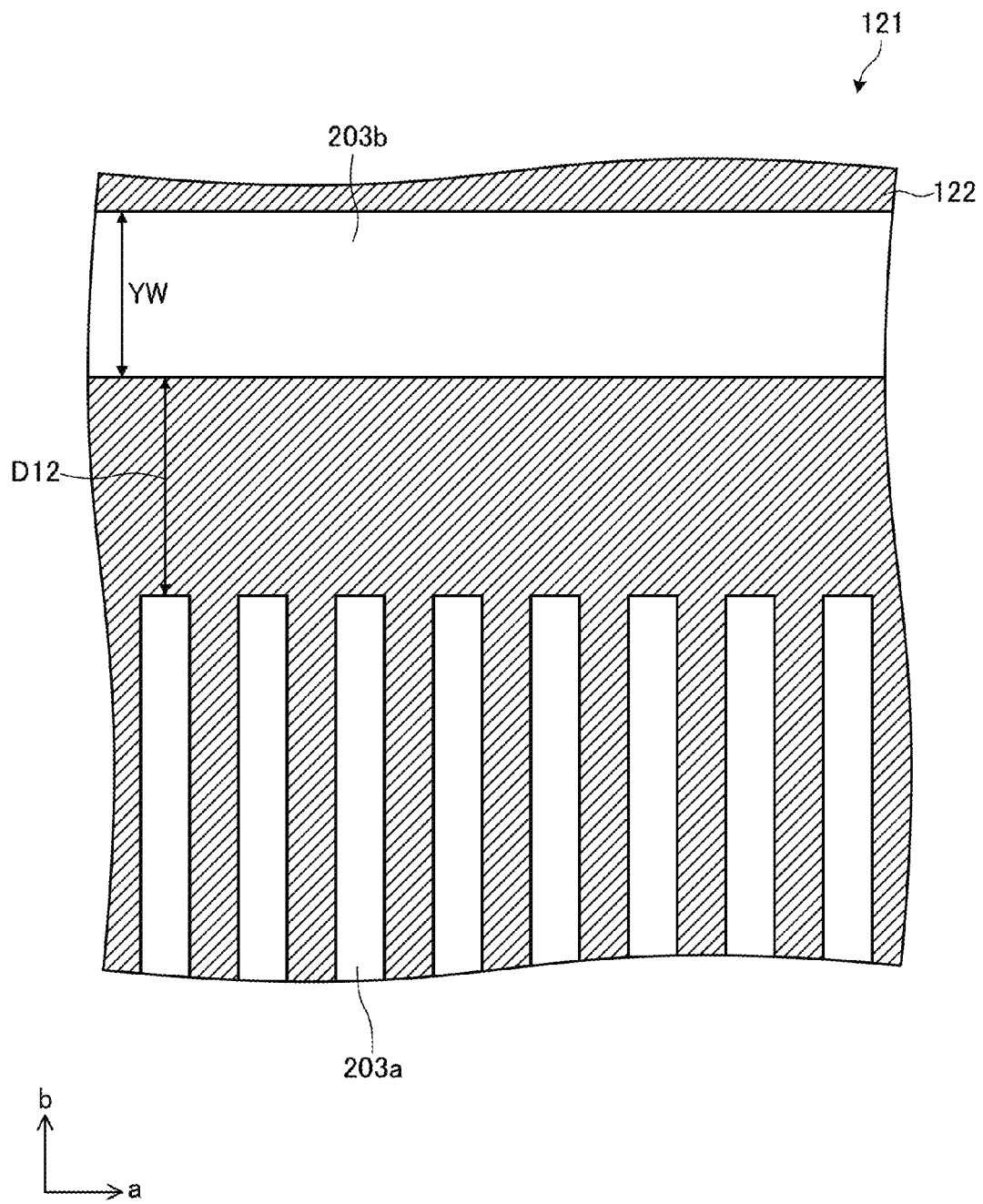
FIG. 22 is a plan view of a typical photomask.

As shown in FIG. 22, a typical photomask 121 has two layers including a not-shown mask blank and a light shielding film 122. A plurality of opening traces 203 are formed in the light shielding film 122.

The light shielding film 122 includes a plurality of opening traces 203a which extend in the b-direction and are arranged in the a-direction. The opening traces 203a have the same dimensions as those of the opening traces 203 shown in FIG. 34. Like FIG. 34, the top ends of the opening traces 203a are in the same position in the b-direction. An opening trace 203b extending in the a-direction is formed near the top ends of the opening traces 203a. The distance D12 from the top ends of the opening traces 203a to the opening trace 203b is 200 nm. The opening trace 203b has a groove width YW of 100 nm.

The opening traces 203 drawn on the photomask 121 are transferred to a resist film 213 to form opening traces 214 in the resist film 213.

Figure 23:
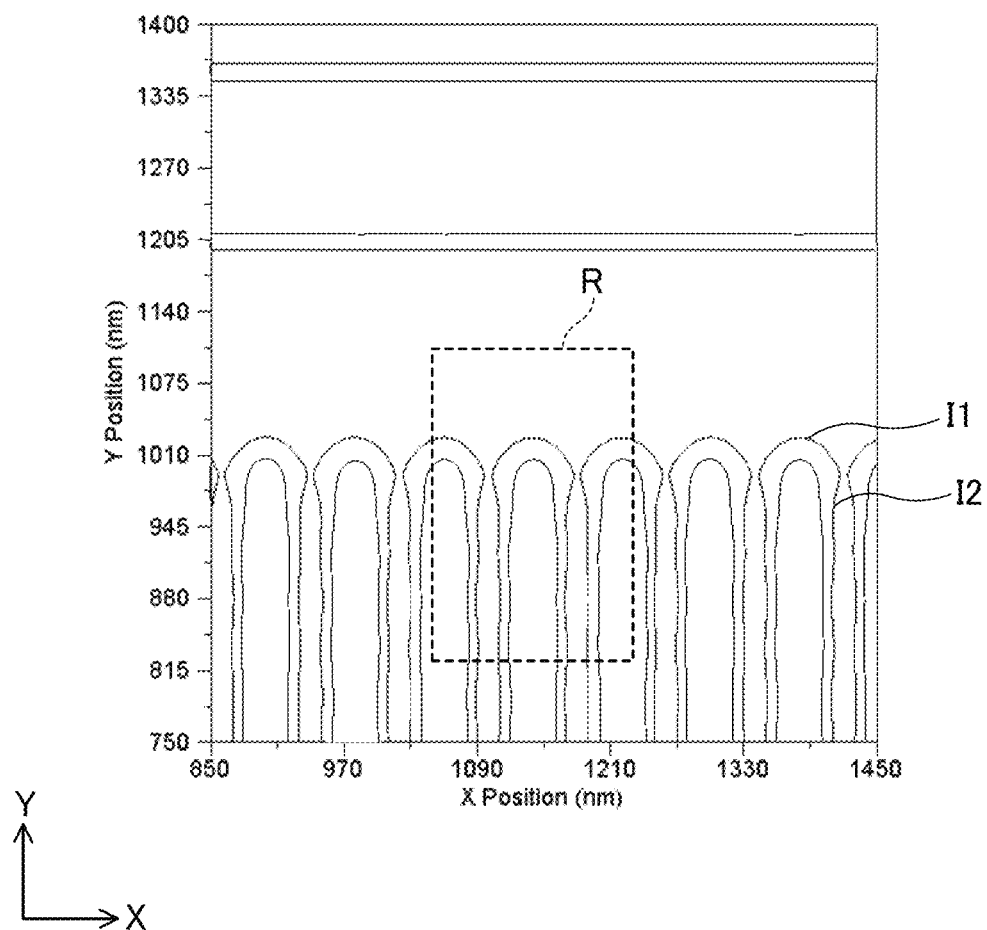
FIG. 23 is a chart showing the relative image intensity distribution resulting from the photomask.
Figure 24:
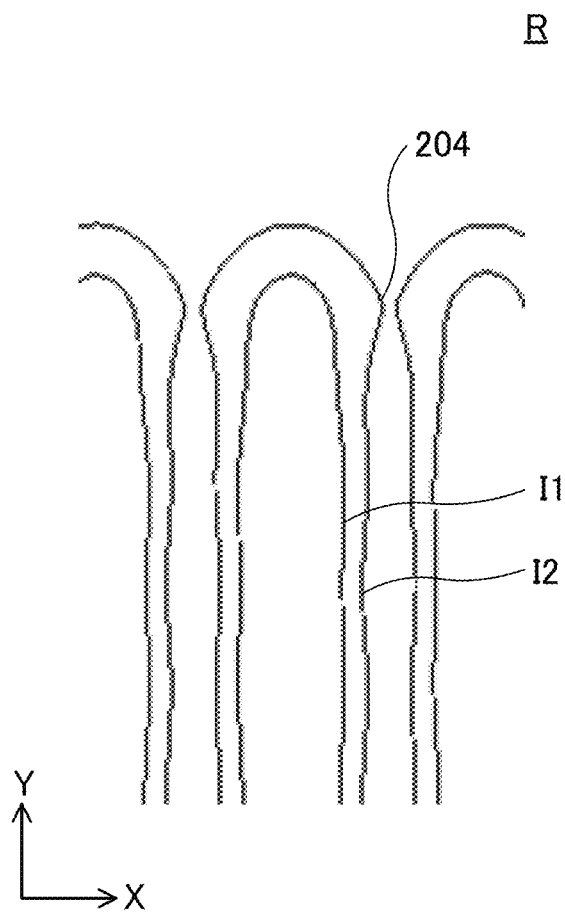
FIG. 24 is an enlarged view of an area R of FIG. 23.

FIG. 23 is a chart showing the relative image intensity distribution resulting from the photomask 121. FIG. 24 is an enlarged view of an area R of FIG. 23. The contours indicate the same relative image intensities. The a- and b-directions of the photomask 121 correspond to the X- and Y-directions of the resist film 213.

The contours I1 indicate a relative image intensity higher than that of the contours I2. Specifically, with the relative image intensity of the contours I1 as 0.211, the relative image intensity of the contours I2 is equivalent to 0.127. The relative image intensity of the contours I1 corresponds to the designed dimensions.

Referring to FIGS. 23 and 24, the contours I1 have a favorable shape extending straight in the Y-direction. The contours I2 of lower relative image intensity (relative image intensity approximately 60% that of the contours I1) laterally spread out at the top ends to form a matchstick-like shape. Expanding areas 204 are greater than the expanding areas 241 shown in FIG. 45, and the adjoining contours I2 are almost making contact with each other. That is, the presence of the opening trace 203b further increases the relative image intensity near the ends of the wiring grooves to increase the possibility of the formation of connecting grooves 222.

Figure 25:
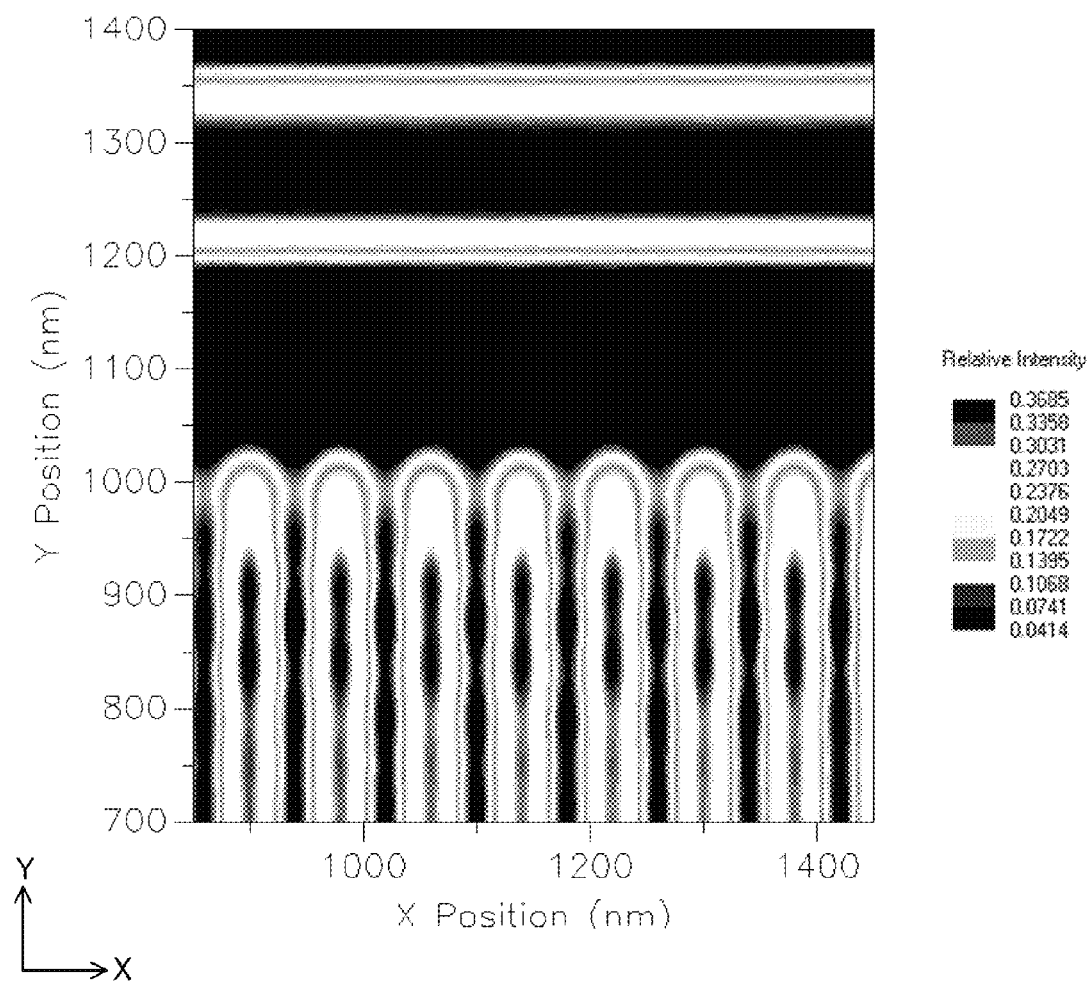
FIG. 25 is a gray-scale display of the relative image intensity distribution of the resist mask.
Figure 26:
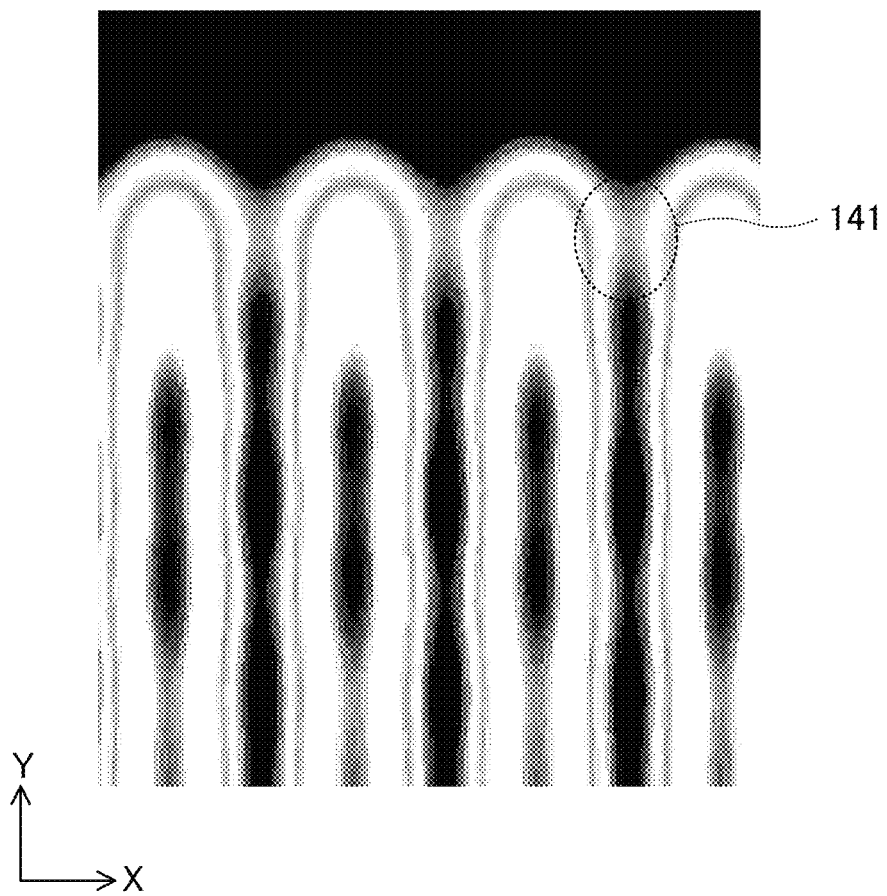
FIG. 26 is a gray-scale display of the relative image intensity distribution of the resist mask.

FIG. 25 is a gray-scale display of the relative image intensity distribution resulting from the photomask 121, divided into 10 equal parts from 0.04 to 0.37. FIG. 26 corresponds to FIG. 24. According to FIGS. 25 and 26, the ends of the opening traces can be connected (area 141) at a relative image intensity of approximately 0.11.

Figure 27:
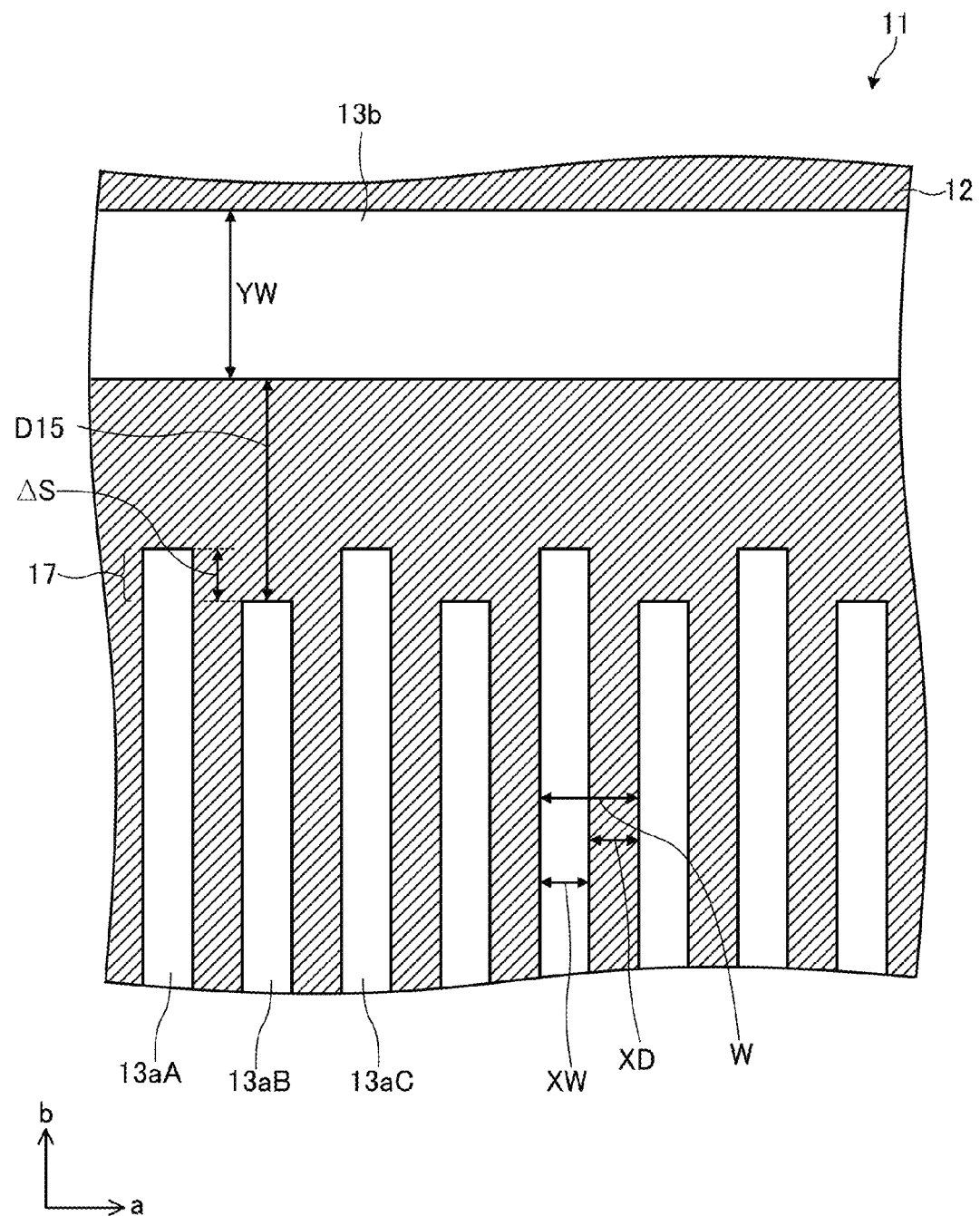
FIG. 27 is a plan view of a photomask according to a second embodiment of the present invention.

FIG. 27 is a plan view of a photomask 11 according to a second embodiment. FIG. 27 corresponds to the enlarged area shown in FIG. 2. The photomask 11 has two layers including a not-shown mask blank and a light shielding film 12. A plurality of opening traces 13 are formed in the light shielding film 12.

Like the first embodiment, the opening traces 13a are arranged with their ends in staggered positions. The amount of protrusion ΔS of the protruding portions 17 is 40 nm, the same as in the first embodiment. An opening trace 13b (fourth opening trace) extending in the a-direction is arranged near the ends of the opening traces 13a. The distance D15 from the opening trace 13aB to the opening trace 13b is 200 nm. The opening trace 13b has a groove width YW of 100 nm.

The opening traces 13 drawn on the photomask 11 are transferred to a resist film 31 to form opening traces 32 in the resist film 31.

Figure 28:
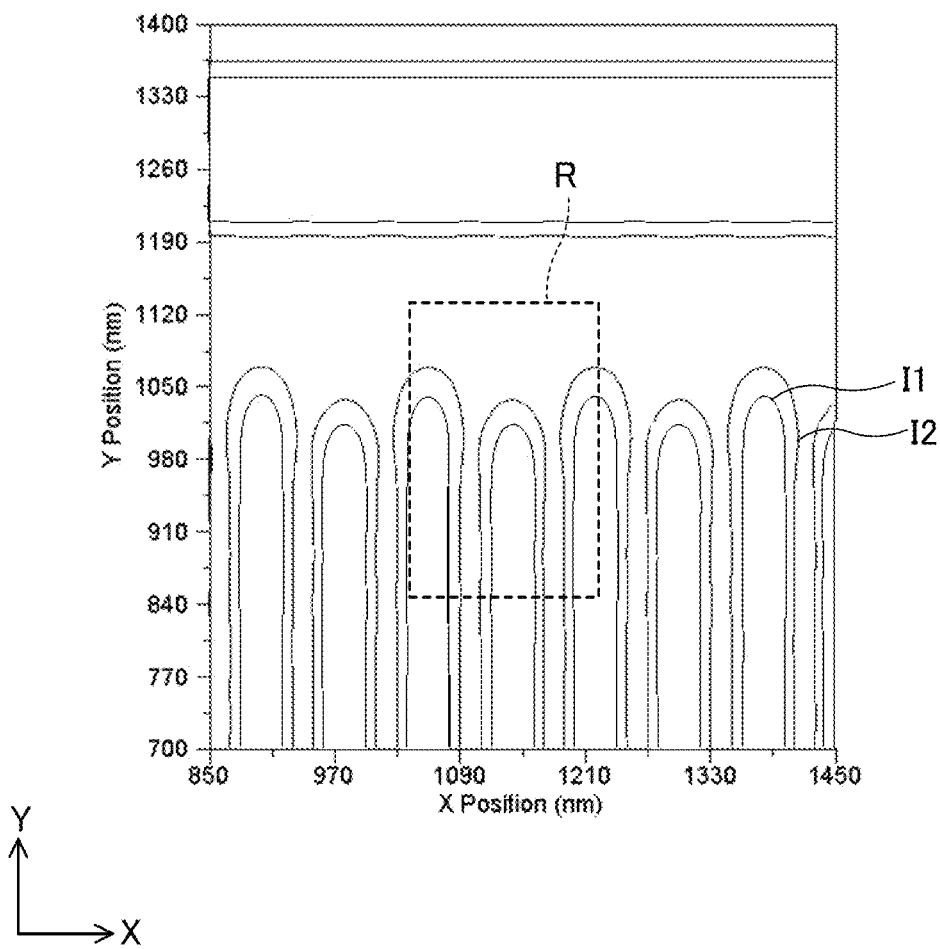
FIG. 28 is a chart showing the relative image intensity distribution resulting from the photomask.
Figure 29:
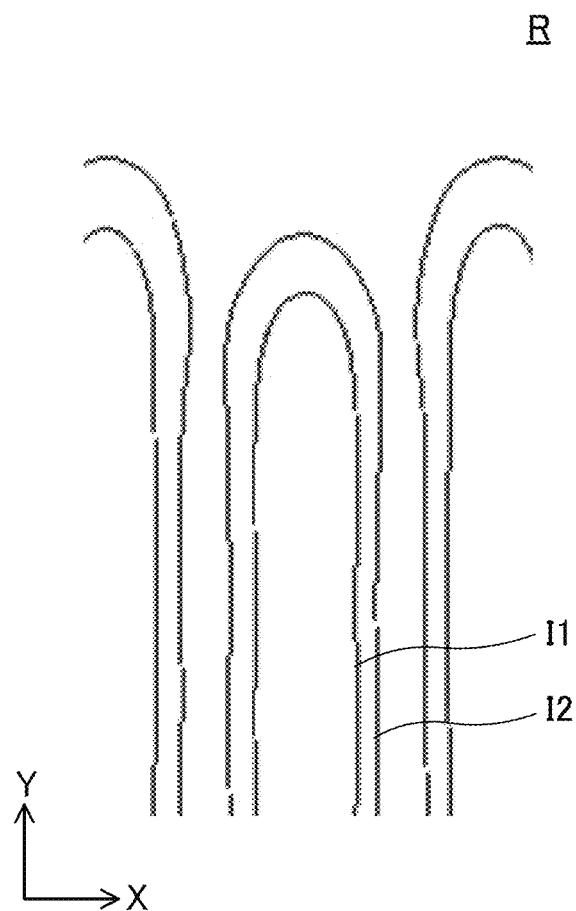
FIG. 29 is an enlarged view of an area R of FIG. 28.

FIG. 28 is a chart showing the relative image intensity distribution resulting from the photomask 11. FIG. 29 is an enlarged view of an area R of FIG. 28. The contours indicate the same relative image intensities. The a- and b-directions of the photomask 11 correspond to the X- and Y-directions of the resist film 31.

The contours I1 indicate a relative image intensity higher than that of the contours I2. Specifically, with the relative image intensity of the contours I1 as 0.211, the relative image intensity of the contours I2 is equivalent to 0.127. The relative image intensity of the contours I1 corresponds to the designed dimensions.

Referring to FIGS. 28 and 29, the contours I1 have a favorable shape extending straight in the Y-direction. The contours I2 of lower relative image intensity also have a favorable, near straight shape, whereas the top ends tend to spread slightly in the lateral direction (X-direction). No clear expanding area 241 is observed at the ends of the opening traces 32. The relative image intensity is found to be sufficiently low across the entire areas of the opening traces 13.

Figure 30:
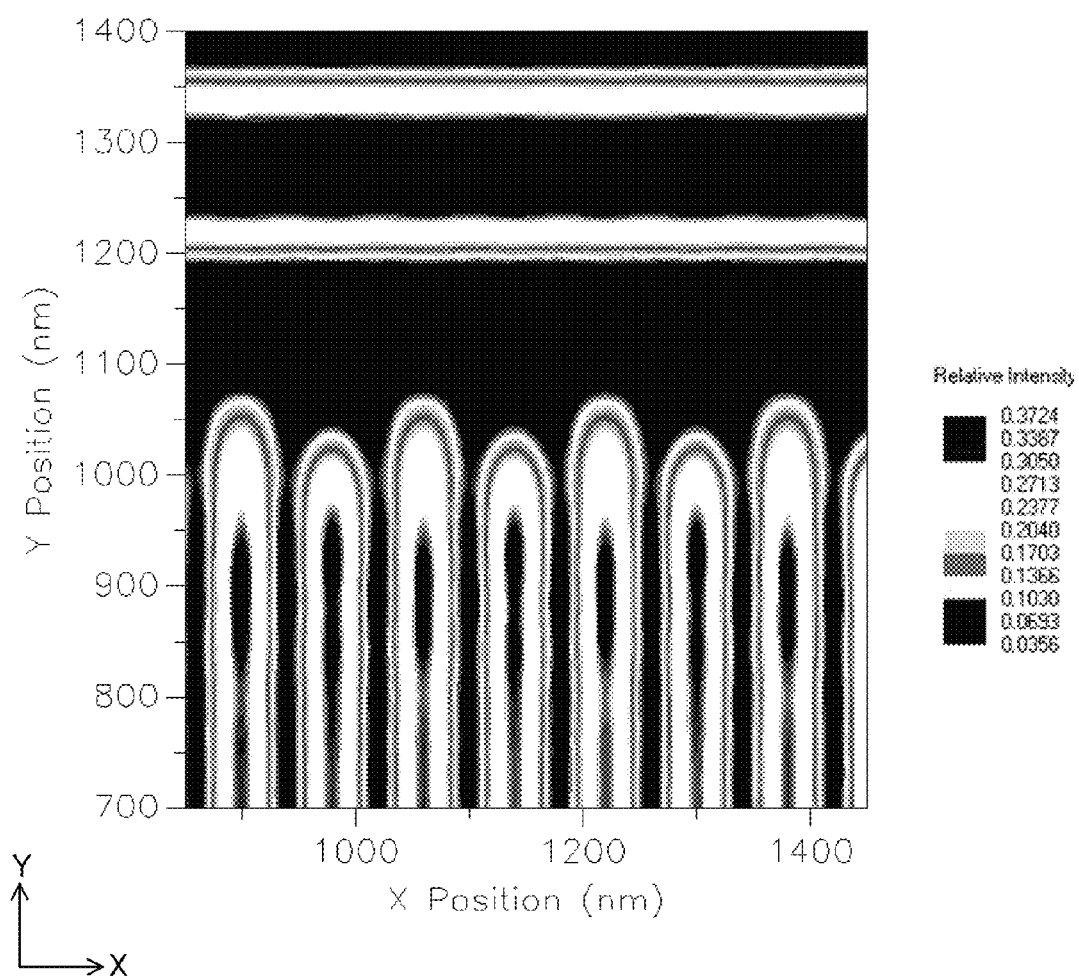
FIG. 30 is a gray-scale display of the relative image intensity distribution of the resist mask.
Figure 31:
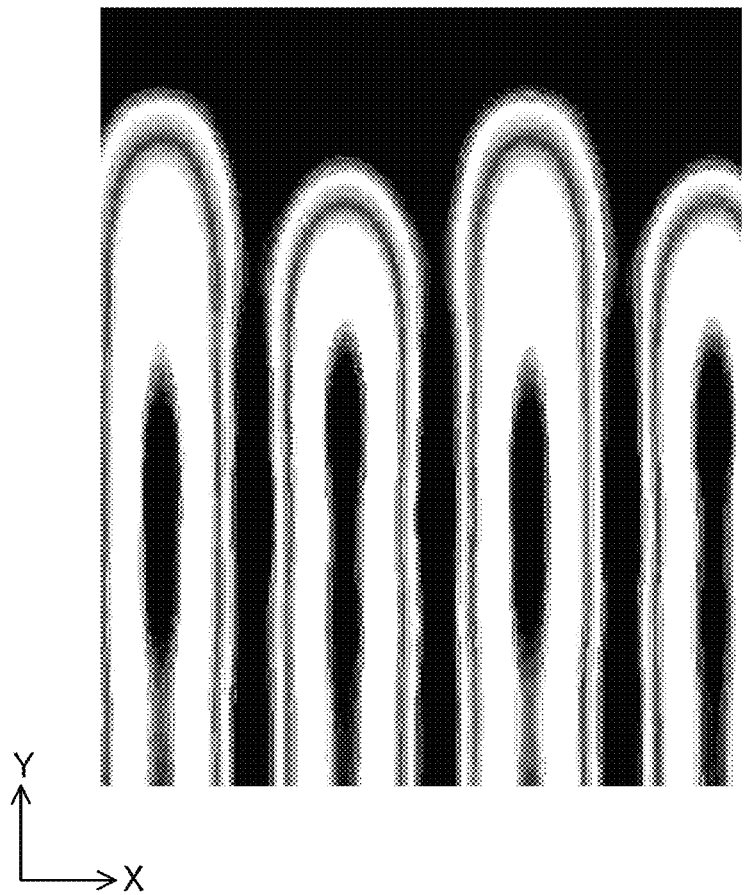
FIG. 31 is a gray-scale display of the relative image intensity distribution of the resist mask.

FIG. 30 is a gray-scale display of the relative image intensity distribution resulting from the photomask 11, divided into 10 equal parts from 0.04 to 0.37. FIG. 31 corresponds to FIG. 26. According to FIGS. 30 and 31, the ends of the opening traces are separated even at a relative image intensity of 0.04 or lower. This shows an improved contrast near the ends. According to the method for arranging the opening traces 13 shown in FIG. 27, the wall traces 33 are less likely to be reduced in thickness even if the opening trace 13b extending in the a-direction lies near the ends of the opening traces 13a.

In the second embodiment, an ArF excimer laser (light source wavelength λ of 193 nm) is used for exposure. The optimum value of the distance D15 depends on the exposure condition. According to a study of the present inventor, the spreading of the complex degree of coherence under normal illumination can be expressed by $L \times \lambda/(\sigma \times NA)$, where L is a coefficient. The complex degree of coherence indicates how far interference fringes of light have effect. The affected range increases as NA decreases and/or the light source becomes smaller. In FIG. 25, the fluctuations of the relative image intensity near the opening traces 203a range up to approximately 400 nm. For cross-pole illumination, σ=σ2−σ1 is substituted into L×λ/(σ×NA). With L of approximately 2, D12=2×λ/(σ×NA). Under cross-pole illumination, the contrast around the opening traces 203a drops significantly when D12≤2×λ/(σ×NA). Using the photomask 11 shown in FIG. 27, a sufficient contrast can be easily secured even if the distance D15 is small. The width YW of the opening trace 13b according to the second embodiment is not limited to 100 nm. The lengths of the opening trace 13b in the a- and b-directions are arbitrary.

Third Embodiment

A third embodiment deals with a case where the second area 15 includes opening traces that extend in the b-direction like the opening traces 13a.

Figure 32:
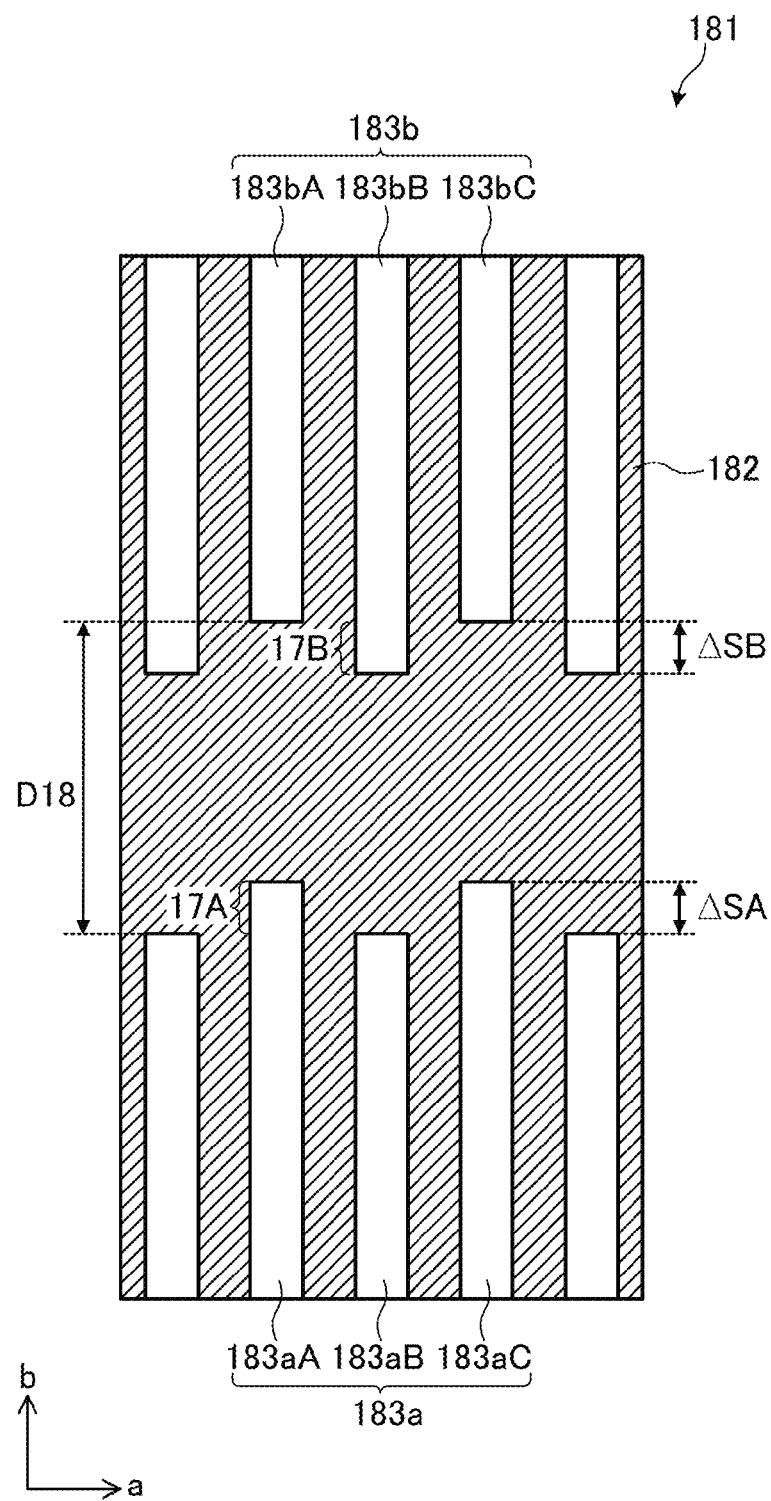
FIG. 32 is a plan view of a photomask according to a third embodiment of the present invention.

FIG. 32 is a plan view of a photomask 181 according to the third embodiment. FIG. 32 corresponds to the enlarged area shown in FIG. 2. The photomask 181 has two layers including a not-shown mask blank and a light shielding film 182. A plurality of opening traces 183 are formed in the light shielding film 182.

Opening traces 183a have the same pattern shape and dimensions as those of the opening traces 13a according to the first embodiment. The ends of the opening traces 183a are shifted to stagger in the a-direction. The protruding portions 17A have the same amount of protrusion ΔSA as the amount of protrusion ΔS according to the first embodiment.

A plurality of opening traces 183b are arranged to be opposed to the opening traces 183a. The opening traces 183b have the same groove width as that of the opening traces 183a. The ends of the opening traces 183b are also shifted to stagger in the a-direction. The protruding portions 17B have the same amount of protrusion ΔSB as the amount of protrusion ΔSA. The distance between the opening traces 183a and the opening traces 183b is 200 nm, for example.

The opening traces 183aA and 183bA are opposed to each other so that the opening trace 183aA (first opening trace) protrudes to the side of the opening trace 183bA (fifth opening trace). The adjoining opening traces 183aB and 183bB are opposed to each other so that the opening trace 183bB (sixth opening trace) protrudes to the side of the opening trace 183aB (second opening trace). In such a manner, the opening traces 183a and the opening traces 183b are opposed to each other so that their ends are in alternately staggered positions.

The light transmitted through the opening traces 183a and the light transmitted through the opening traces 183b have effect on each other. However, the staggered arrangement of the ends of the opening traces 183a and the staggered arrangement of the ends of the opening traces 183b as shown in FIG. 32 can sufficiently reduce the relative image intensity other than in the wiring grooves.

Fourth Embodiment

In a fourth embodiment, the protruding portions 17A and 17B of the opening traces 183a and 183b described in the third embodiment are widened in width. Such a configuration can further enhance the contrast near the opening traces 183aB and 183bA having no protruding portion 17, and thereby facilitates maintaining the thickness of the wall traces 33.

Figure 33:
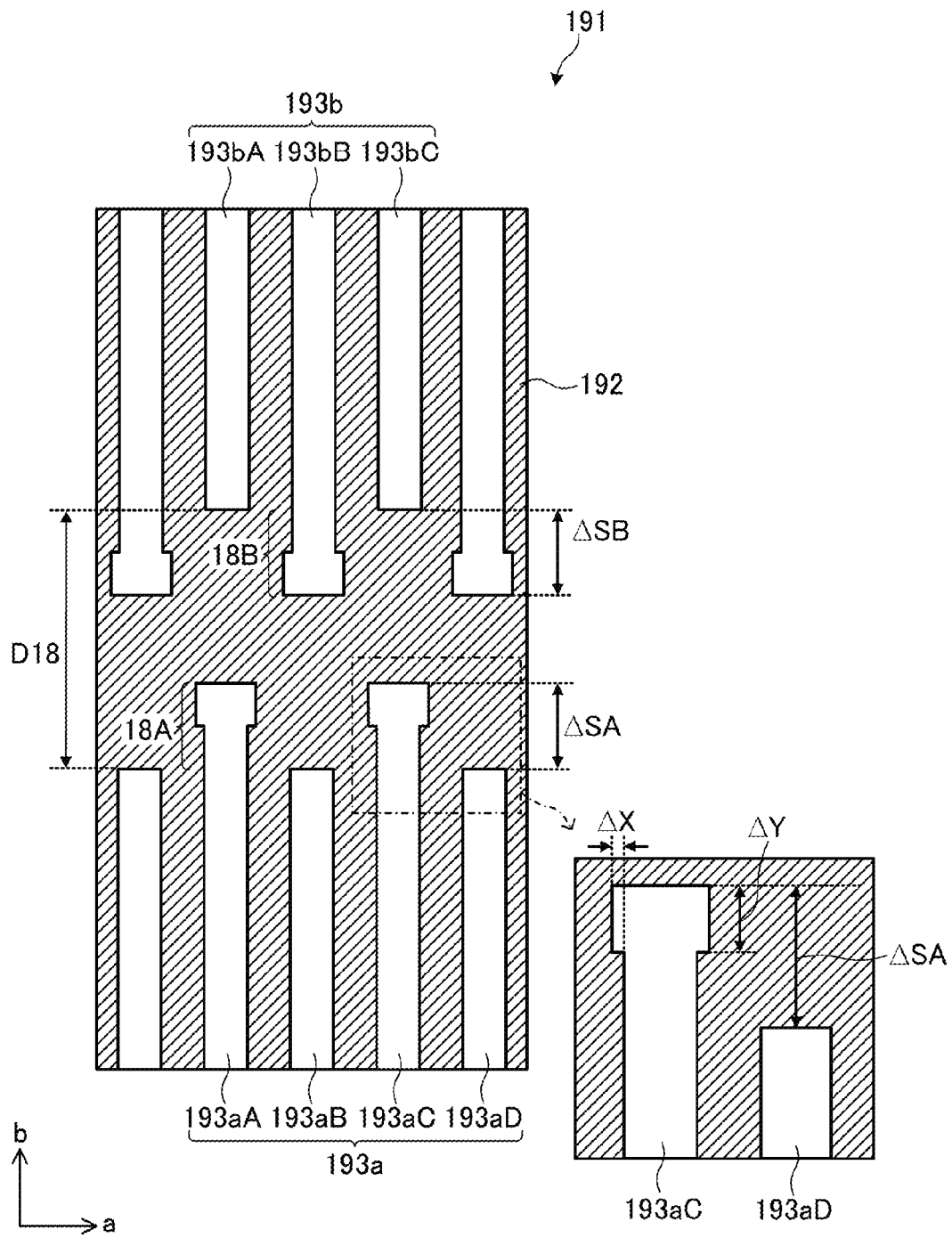
FIG. 33 is a plan view of a photomask according to a fourth embodiment of the present invention.

FIG. 33 is a plan view of a photomask 191 according to the fourth embodiment. FIG. 33 corresponds to the enlarged area shown in FIG. 2. The photomask 191 has two layers including a not-shown mask blank and a light shielding film 192. A plurality of opening traces 193 are formed in the light shielding film 192.

The amount of protrusion ΔSA of the protruding portions 18A of opening traces 193a and the amount of protrusion ΔSB of the protruding portions 18B of opening traces 193b are the same as in the third embodiment. The opening traces 193a and 193b are basically in the same arrangement as that of the opening traces 183a and 183b according to the third embodiment. The distance D18 between the opening traces 193a and the opening traces 193b is 200 nm, for example. The effects of the present invention become more significant when D18 is smaller than or equal to the light source wavelength of the exposure light.

In the fourth embodiment, the ends of the opening traces 193aA, 193aC, and 193bB protruding in the b-direction are widened in width. A description will be given below with a focus on the opening trace 193aC having the end of widened width. The amount of widening at the end portion of the opening trace 193aC in the a-direction will be denoted by ΔX, and the amount of widening in the b-direction by ΔY. To prevent the ends of the adjoining opening traces 193a from being connected, ΔX is set not to exceed the groove width. The width is desirably widened when a sufficient space can be secured above the opening trace 193aC.

In the fourth embodiment, ΔX=10 nm and ΔY=40 nm. The width of the protruding portions 18A in the a-direction is 60 nm. The amount of protrusion ΔSA in the b-direction is 80 nm. The widening of the end of the opening trace 193aC further enhances the diffracted light formed near the end. This facilitates maintaining the thickness of the resist film 31 around the wiring groove.

Up to this point, the photomask and the semiconductor device using the same have been described in conjunction with the first to fourth embodiments. Shifting the ends of the adjoining opening traces 13 facilitates maintaining the thickness of the wall traces 33 of the resist film 31 as compared to heretofore.

It is apparent that the present invention is not limited to the above embodiments, but may be modified and changed without departing from the scope and spirit of the invention.

In addition, while not specifically claimed in the claim section, the applicant reserves the right to include in the claim section of the application at any appropriate time the following photomasks, semiconductor devices and methods:

A1. A photomask comprising:
a mask blank; and
a light shielding film formed on the mask blank, the light shielding film including a plurality of opening traces extending in a first direction, the plurality of opening traces including at least first and second opening traces located adjacent to each other, an end of the first opening trace in the first direction and an end of the second opening trace in the first direction being in different positions in the first direction.

A2. The photomask according to A1, wherein the plurality of opening traces are arranged in a second direction substantially orthogonal to the first direction.

A3. The photomask according to A1, wherein the plurality of opening traces further includes a third opening trace, the second opening trace being sandwiched between the first and third opening traces, the end of the first opening trace and an end of the third opening trace in the first direction are in substantially the same positions in the first direction.

A4. The photomask according to A1, wherein a length of the first opening trace in the first direction substantially coincides with a length of the second opening trace in the first direction.

A5. The photomask according to A1, wherein a length of the first opening trace in the first direction is greater than a length of the second opening trace in the first direction.

A6. The photomask according to A1, wherein a space between the first opening trace and the second opening trace, a width of the first opening trace, and a width of the second opening trace substantially coincide with one another.

A7. The photomask according to A1, wherein a distance between the end of the first opening trace and the end of the second opening trace in the first direction is greater than or equal to an average value of a space between the first opening trace and the second opening trace and a width of the first opening trace.

A8. The photomask according to A2, wherein the light shielding film further includes a fourth opening trace extending in the second direction, the fourth opening trace being arranged at the ends of the first opening trace and the second opening trace.

A9. The photomask according to A1, wherein
the light shielding film further includes a fifth opening trace extending in the first direction and a sixth opening trace extending in the first direction, the fifth opening trace being arranged on an extension of the first opening trace in the first direction, the sixth opening trace being arranged on an extension of the second opening trace in the first direction, and
an end of the fifth opening trace in the first direction and an end of the sixth opening trace in the first direction are in different positions in the first direction.

A10. The photomask according to A9, wherein a distance between the ends of the first and fifth opening traces is substantially equal to a distance between the ends of the second and sixth opening traces.

A11. The photomask according to A1, wherein the first opening trace protrudes from the second opening trace in the first direction, and its protruded portion is widened in width.

A12. A semiconductor device comprising:
a semiconductor substrate; and
an insulation film formed on the semiconductor substrate, the insulation film including a plurality of wiring grooves extending in a first direction, the plurality of wiring grooves including at least first and second wiring grooves located adjacent to each other, an end of the first wiring groove in the first direction and an end of the second wiring groove in the first direction being in different positions in the first direction.

A13. A method for manufacturing a semiconductor device, the method comprising:
forming an insulation film on a semiconductor substrate;
forming a resist film on the insulation film;
exposing the resist film via a photomask that includes a light shielding film having a plurality of opening traces;
removing either exposed portions or unexposed portions of the resist film to form a transfer pattern in the resist film; and
etching the insulation film by using the transfer pattern of the resist film as a mask, thereby forming a plurality of wiring grooves corresponding to the transfer pattern in the insulation film,
the plurality of opening traces extending in a first direction, the plurality of first opening traces including at least first and second opening traces located adjacent to each other, an end of the first opening trace in the first direction and an end of the second opening trace in the first direction being in different positions in the first direction.

A14. The method for manufacturing a semiconductor device according to A13, wherein the exposing includes exposing the resist film via the photomask by oblique incidence illumination.

A15. The method for manufacturing a semiconductor device according to A13, wherein the plurality of opening traces of the light shielding film are arranged in a second direction substantially orthogonal to the first direction.

A16. The method for manufacturing a semiconductor device according to A15, wherein the light shielding film further includes a fourth opening trace extending in the second direction, the fourth opening trace being arranged at the ends of the first opening trace and the second opening trace.

A17. The method for manufacturing a semiconductor device according to A13, further comprising embedding wiring material into the wiring grooves formed in the insulation film.

What is claimed is:

1. A semiconductor device comprising:
a semiconductor substrate on which a predetermined layer is formed;
a first pattern extending in plan view in a first direction in the predetermined layer;
a second pattern extending in the plan view in parallel with the first pattern in the predetermined layer; and
a third pattern between the first and second patterns extending in the plan view in parallel with the first and second patterns in the predetermined layer,
wherein the first, second and third patterns have first, second and third end portions in the first direction, respectively,
wherein the first and third end portions are arranged in different positions staggered from each other in the plan view in the first direction,
wherein the first and the second end portions are substantially aligned along a second direction orthogonal to the first direction, and
wherein the first, second, and third patterns occupy a common plane in the predetermined layer extending in the first direction.

2. The semiconductor device as claimed in claim 1, wherein the first and second end portions are arranged in substantially the same position as each other in the first direction.

3. The semiconductor device as claimed in claim 1, wherein the first to third patterns have substantially the same width as each other.

4. The semiconductor device as claimed in claim 1, wherein the first, second and third patterns have first, second and third body portions connected to the first, second and third end portions, respectively, and the first, second and third end portions are greater in width than the first, second and third body portions, respectively.

5. The semiconductor device as claimed in claim 1, wherein a space between the first and third patterns is substantially equal to a space between the second and third patterns.

6. The semiconductor device as claimed in claim 1, wherein the first to third patterns comprise a conductive material.

7. The semiconductor device as claimed in claim 6, wherein the first to third patterns are insulated with each other by an insulating film.

8. The semiconductor device as claimed in claim 1, wherein a distance between the first and third end portions in the first direction is greater than a space between the first and third patterns.

9. The semiconductor device as claimed in claim 8, wherein a distance between the first and second end portions in the first direction is shorter than the space between the first and third patterns.

10. The semiconductor device as claimed in claim 1, further comprising a fourth pattern extending in a second direction different from the first direction.

11. The semiconductor device as claimed in claim 10, wherein the fourth pattern is formed on the predetermined layer.

12. The semiconductor device as claimed in claim 1, wherein a lower width of each of the first to third patterns is narrower than an upper width thereof.

13. The semiconductor device as claimed in claim 1, further comprising a fourth pattern extending in the first direction, wherein a width of the fourth pattern is greater than that of each of the first to third patterns.

14. The semiconductor device as claimed in claim 13, wherein the fourth pattern is formed on the predetermined layer.

15. A semiconductor device comprising:
a semiconductor substrate;
a layer formed on the semiconductor substrate, the layer having, in plan view, a first area and a second area, first and second areas being adjacent to each other in a first direction;
a first pattern set of traces located within the layer in the first area, the first pattern set of traces adjacently arranged in the first direction with each trace of the first pattern set extending, in the plan view, in the layer in a second direction, each of the traces of the first pattern set having a first end point and an opposite second end point, the first end points substantially defining a first line extending, in the plan view, in the first direction, and the second end points substantially defining a second line extending, in the plan view, in the first direction;
a second pattern set of traces located within the layer in the second area, the second pattern set of traces adjacently arranged in the first direction with each trace of the second pattern set extending, in the plan view, in the layer in the second direction such that the second pattern set of traces extend in parallel with the first pattern set of traces in the layer, each of the traces of the second pattern set having a third end point and an opposite fourth end point, the third end points substantially located on the first line extending, in the plan view, in the first direction, and the fourth end points substantially located on the second line extending, in the plan view, in the first direction; and
a third pattern set of traces located within the layer in the first area, the third pattern set of traces adjacently arranged in the first direction with each trace of the third pattern set extending, in the plan view, in the layer in the second direction such that the second pattern set of traces extend in parallel with the first pattern set of traces in the layer, wherein individual traces of the third pattern set are located between two adjacent traces of the first pattern set, each of the traces of the third pattern set having a fifth end point and an opposite sixth end point, the fifth end points substantially defining a third line extending, in the plan view, in the first direction and offset in the second direction a non-zero amount from the first line, and the sixth end points substantially defining a fourth line extending, in the plan view, in the first direction and offset in the second direction a non-zero amount from the second line so as i) to stagger adjacent ones of the first end points and the fifth end points with respect to each other in the second direction, and ii) to stagger adjacent ones of the second and sixth end points with respect to each other in the second direction,
wherein the first, second, and third set of traces occupy a common plane in the layer.

16. The semiconductor device as claimed in claim 15, wherein
the layer formed on the semiconductor substrate further includes a third area, the first and third areas being adjacent to each other in the second direction, and the second and third areas being adjacent to each other in the second direction, and further comprising:
a fourth pattern set of traces located with the layer in the third area, the fourth pattern set of traces adjacently arranged in the second direction with each trace of the fourth pattern set extending, in the plan view, in the layer in the first direction such that the fourth pattern set of traces extend in the first direction orthogonally with respect to the first, second, and third pattern sets of traces in the layer,
wherein each of the traces of the fourth pattern set has a seventh end point and an opposite eighth end point, the seventh end points substantially located on a fifth line extending in the second direction, and the eighth end points substantially located on a sixth line extending in the second direction.

* * * * *